(12) United States Patent
Hung et al.

(10) Patent No.: US 11,087,858 B1
(45) Date of Patent: Aug. 10, 2021

(54) IN-PLACE REFRESH OPERATION IN FLASH MEMORY

(71) Applicant: MACRONIX INTERNATIONAL CO., LTD., Hsinchu (TW)

(72) Inventors: Shuo-Nan Hung, Hsinchu (TW); Chun-Lien Su, Taichung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/938,500

(22) Filed: Jul. 24, 2020

(51) Int. Cl.
| | |
|---|---|
| *G11C 16/16* | (2006.01) |
| *G11C 29/44* | (2006.01) |
| *G11C 29/42* | (2006.01) |
| *G11C 16/26* | (2006.01) |
| *G11C 29/00* | (2006.01) |
| G11C 29/18 | (2006.01) |

(52) U.S. Cl.
CPC ............. *G11C 29/44* (2013.01); *G11C 16/16* (2013.01); *G11C 16/26* (2013.01); *G11C 29/42* (2013.01); *G11C 29/783* (2013.01); *G11C 2029/1806* (2013.01)

(58) Field of Classification Search
CPC ......... G11C 29/44; G11C 16/16; G11C 16/26; G11C 29/42; G11C 29/783
USPC ......................................................... 365/201
See application file for complete search history.

(56) References Cited

U.S. PATENT DOCUMENTS

| | | | |
|---|---|---|---|
| 10,445,200 B2* | 10/2019 | Park | G06F 11/0751 |
| 2014/0160858 A1* | 6/2014 | Lee | G11C 16/0483 |
| | | | 365/185.25 |
| 2017/0286219 A1 | 10/2017 | Chae | |
| 2017/0315891 A1* | 11/2017 | Park | G11C 29/883 |

* cited by examiner

*Primary Examiner* — Xiaochun L Chen
(74) *Attorney, Agent, or Firm* — Haynes Beffel & Wolfeld LLP

(57) ABSTRACT

A memory device comprises, on an integrated circuit or multi-chip module, a memory including a plurality of memory blocks, a controller, and a refresh mapping table in non-volatile memory accessible by the controller. The controller is coupled to the memory to execute commands with addresses to access addressed memory blocks in the plurality of memory blocks. The refresh mapping table has one or more entries, an entry in the refresh mapping table mapping of an address identifying an addressed memory block set for refresh to a backup block address. The controller is responsive to a refresh command sequence with a refresh block address to execute a refresh operation, and is configured to restore mapping of the refresh block address to the backup block address upon power-on of the device, to scan the refresh mapping table for a set entry, and to register the set entry in the refresh mapping table.

15 Claims, 14 Drawing Sheets

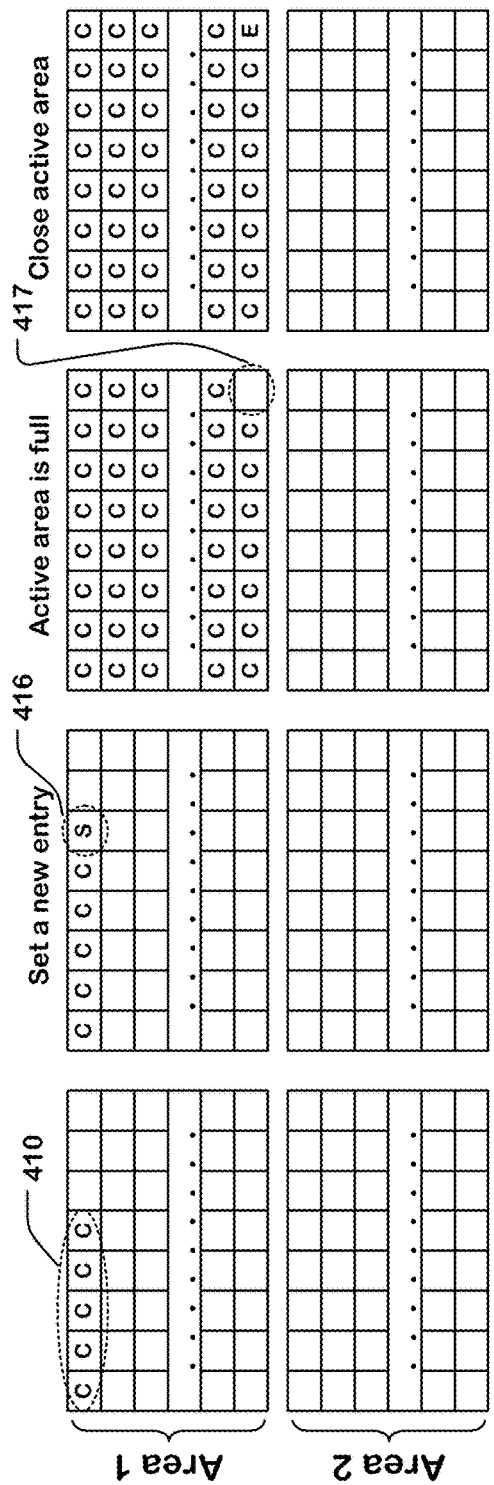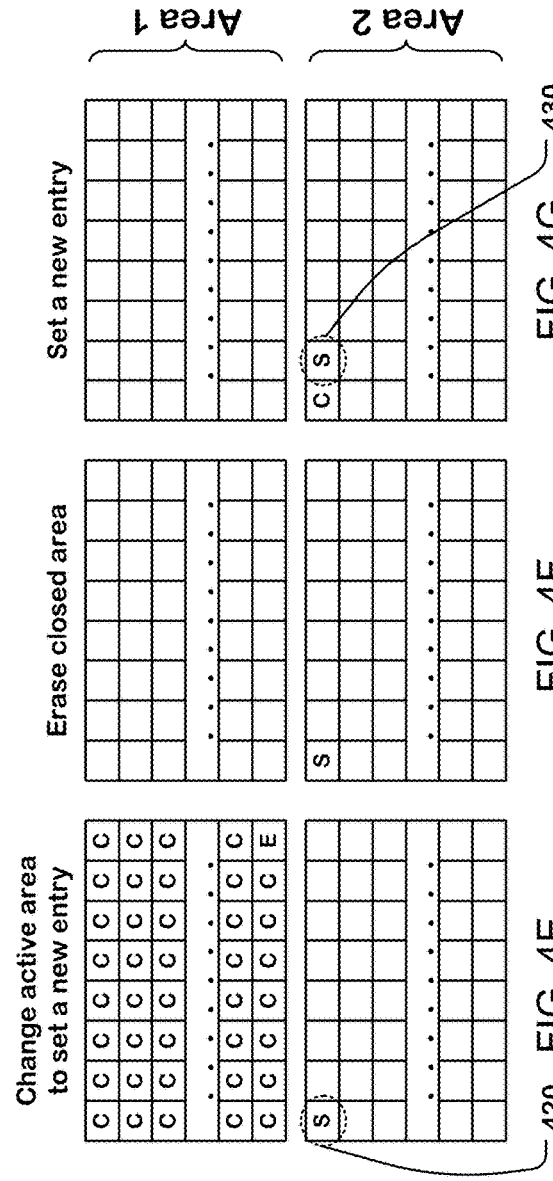

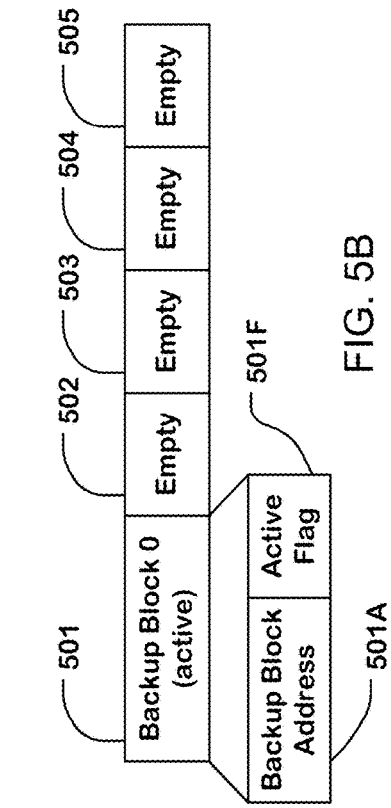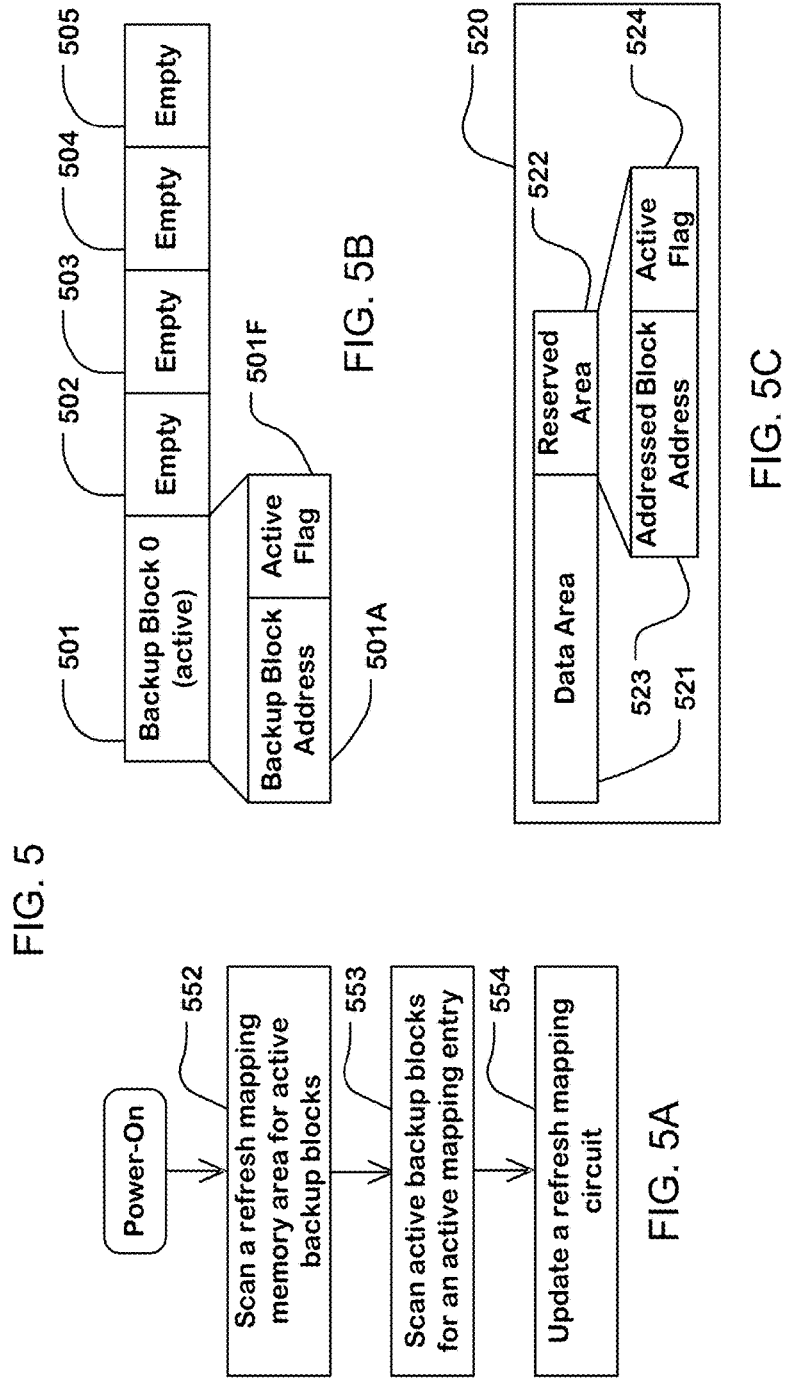

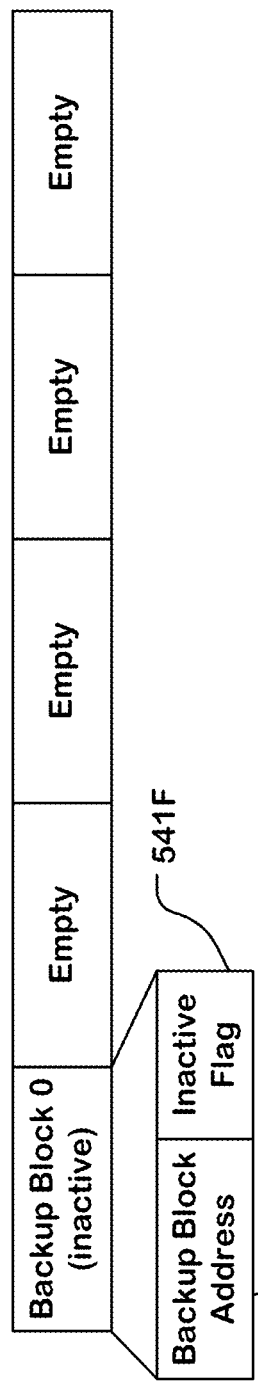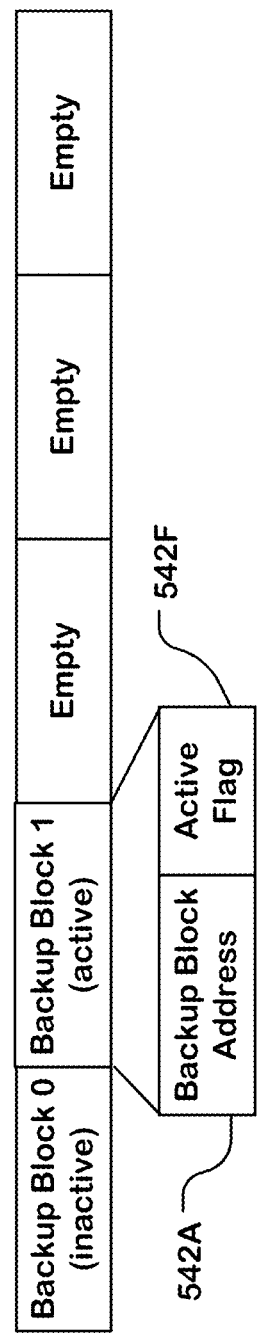

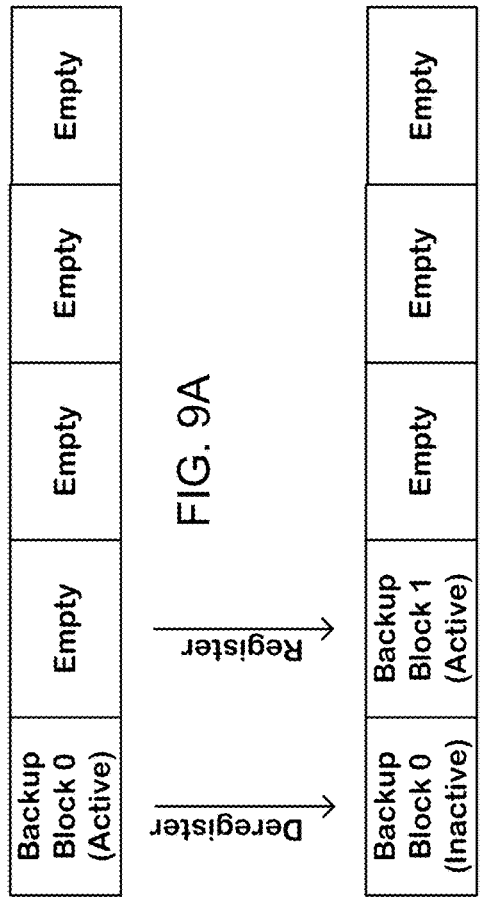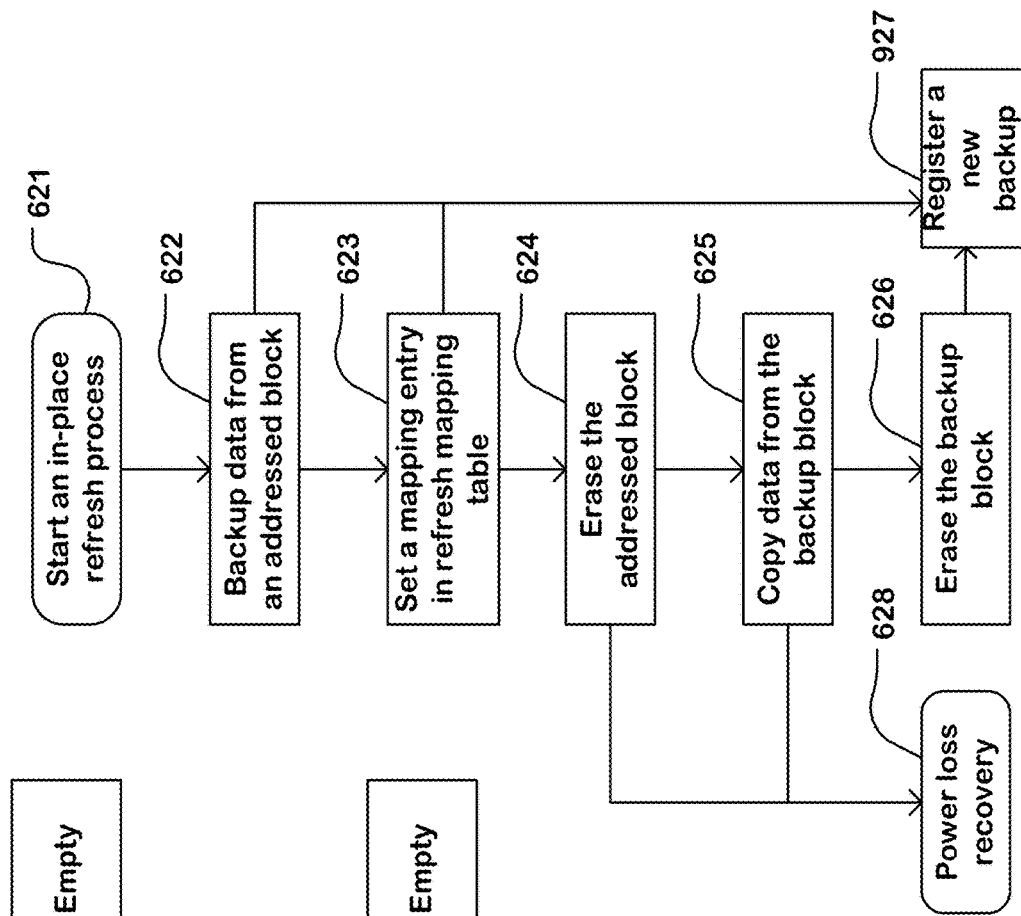
FIG. 9A
FIG. 9B
FIG. 9C

IN-PLACE REFRESH OPERATION IN FLASH MEMORY

BACKGROUND

Field

The present invention relates to memory management in memory devices and systems including memory refreshing.

Description of Related Art

Memory technologies used for integrated circuit memories are being developed at smaller and smaller technology nodes, and are being deployed on larger and larger memory arrays on a single integrated circuit. As the technology for memory cells advances, the margins for sensing the data can become tighter. Also, the ability of the memory cells to hold data values in the presence of disturbance of the memory cell state caused by high speed and high volume accesses to the memory cells and to neighboring memory cells can be limited by the tighter margins.

To address issues like those that arise from tighter margins and memory cell disturbance, as these technologies scale in size and density, use of error correcting codes (ECCs) embedded with integrated circuit memory has become more widespread. In addition to correcting erroneous memory bits in a memory device, ECC information that may be produced in the process of correcting may be used for memory management functions.

Another problem that arises in many memory technologies relates to the tendency of the data stored in the memory cells to be disturbed over time by exposure to heat, exposure to electric fields caused by operations on adjacent memory cells and other environmental and operational conditions. Data errors caused by disturbance of the memory cells can be handled in many cases by error correction logic. However for some memory technologies, the tendency to lose data can increase over time as a memory block wears out. Eventually, the ECC logic may not be able to correct all the errors accumulating as a memory block wears out.

Complex wear leveling programs have been developed to manage this problem, adding a logical to physical address mapping, and changing the mapping of logical addresses that have high levels of activity to new physical blocks as the wear limits of physical blocks are reached.

It is desirable to provide a solution usable in systems in which complex wear leveling programs are not available.

SUMMARY

A memory device comprises a memory including a plurality of memory blocks on an integrated circuit or multi-chip module, a controller on the integrated circuit or multi-chip module coupled to the memory to execute commands with addresses to access addressed memory blocks in the plurality of memory blocks, and a refresh mapping table in non-volatile memory on the integrated circuit or multi-chip module accessible by the controller. The refresh mapping table has one or more entries, an entry in the refresh mapping table mapping of an address identifying an addressed memory block set for refresh to a backup block address.

The controller is responsive to a refresh command sequence with a refresh block address to execute a refresh operation. The refresh operation includes storing a backup copy of data from the addressed memory block having the refresh block address to a backup block, setting an entry in the refresh mapping table to map the refresh block address to the backup block, refreshing the addressed memory block having the refresh block address using data from the backup block, and resetting the entry upon completion of the refresh operation for the addressed memory block.

The controller is configured to execute a procedure to restore mapping of the refresh block address to the backup block address upon power-on of the memory device, to scan the refresh mapping table for a set entry mapping the refresh block address to the backup block address, and to register the set entry in the refresh mapping table. The refresh mapping table includes a refresh mapping memory area storing the one or more entries, and a refresh mapping circuit registering the set entry mapping the refresh block address to the backup block.

A method is provided for operating a memory device by a controller of the memory device. A controller can execute a procedure to restore mapping of the refresh block address to the backup block address upon power-on of the memory device, by scanning the refresh mapping table for a set entry mapping the refresh block address to the backup block address, and registering the set entry in the refresh mapping table. The refresh mapping table includes a refresh mapping memory area storing the one or more entries, and a refresh mapping circuit. The method comprises scanning the refresh mapping memory area in the refresh mapping table for the set entry, and registering the set entry mapping the refresh block address to the backup block in the refresh mapping circuit in the refresh mapping table.

A method is provided for operating a memory device by an external host coupled to the memory device. The method comprises executing a refresh operation by issuing a refresh command sequence with a refresh block address to the memory device. The refresh operation includes storing a backup copy of data from the addressed memory block at the refresh block address in a backup block; setting a mapping entry in the refresh mapping table to map the refresh block address to an address of the backup block; refreshing the addressed memory block at the refresh block address using data from the backup block; and resetting the mapping entry upon completion of the refresh operation for the addressed memory block.

Said refreshing the addressed memory block can include erasing the addressed memory block at the refresh block address; and then copying the backup copy from the backup block to the addressed memory block. The refresh operation can include prior to said storing the backup copy in the backup block, erasing the backup block.

In one embodiment, the refresh mapping table comprises a journal format table, wherein setting the mapping entry includes writing a valid entry in the journal format table; and resetting the entry includes marking the entry invalid.

In an alternative embodiment, the refresh mapping table comprises a backup block list registering a set of backup blocks, with the entries stored inside corresponding backup blocks in the set of backup blocks. Said setting the entry can include writing an active flag in an available block in the set of backup blocks. Said resetting the entry can include erasing at least the active flag or writing an invalid flag in the block.

The refresh operation can comprise determining status of a copying operation started before an interrupt, if the status indicates the copying operation is not recoverable, erasing the addressed memory block and copying the backup copy from the backup block to the addressed memory block, and if the status indicates the copying operation is recoverable, resetting the mapping entry upon completion of the refresh operation for the addressed memory block.

The method can include, prior to said executing the refresh operation, issuing a command sequence for fetching data from the memory device at the input block address; checking ECC status for the fetched data on the input block address; and if the ECC status indicates a block at the input block address needs refresh, registering the refresh command sequence with the input block address in the host including registering the input block address as the refresh block address in the host.

Other aspects and advantages of the present invention can be seen on review of the drawings, the detailed description and the claims, which follow.

BRIEF DESCRIPTION OF THE DRAWINGS

FIGS. 4A-4G illustrate an embodiment of a refresh mapping table including a journal format table.

FIG. 5 illustrates an alternative embodiment of a refresh mapping table storing a backup block list that registers a set of backup blocks and their activation status.

FIG. 5A illustrates an example flowchart for a power-on procedure by a controller in a memory device that includes an alternative embodiment of a refresh mapping table as shown in FIG. 5.

FIG. 5B illustrates initialization of a backup block list registering a set of backup blocks.

FIG. 5C illustrates the data arrangement in a backup block in a first embodiment.

FIGS. 6A-6B illustrate deregistering an old backup block and registering a new backup block in a backup block list stored in a refresh mapping table.

FIGS. 9A, 9B and 9C illustrate a second embodiment of a backup block list, where a backup block list can register only a single active backup block at a time.

DETAILED DESCRIPTION

The following description will typically be with reference to specific structural embodiments and methods. It is to be understood that there is no intention to limit the technology to the specifically disclosed embodiments and methods but that the technology may be practiced using other features, elements, methods and embodiments. Preferred embodiments are described to illustrate the present technology, not to limit its scope, which is defined by the claims. Those of ordinary skill in the art will recognize a variety of equivalent variations on the description that follows. A detailed description of embodiments of the present invention is provided with reference to the Figures.

Figure 1B:
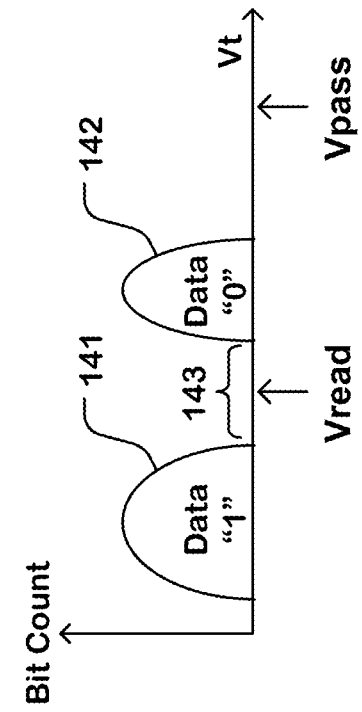
FIG. 1B illustrates example distributions of threshold voltages Vt of memory cells.
Figure 1A:
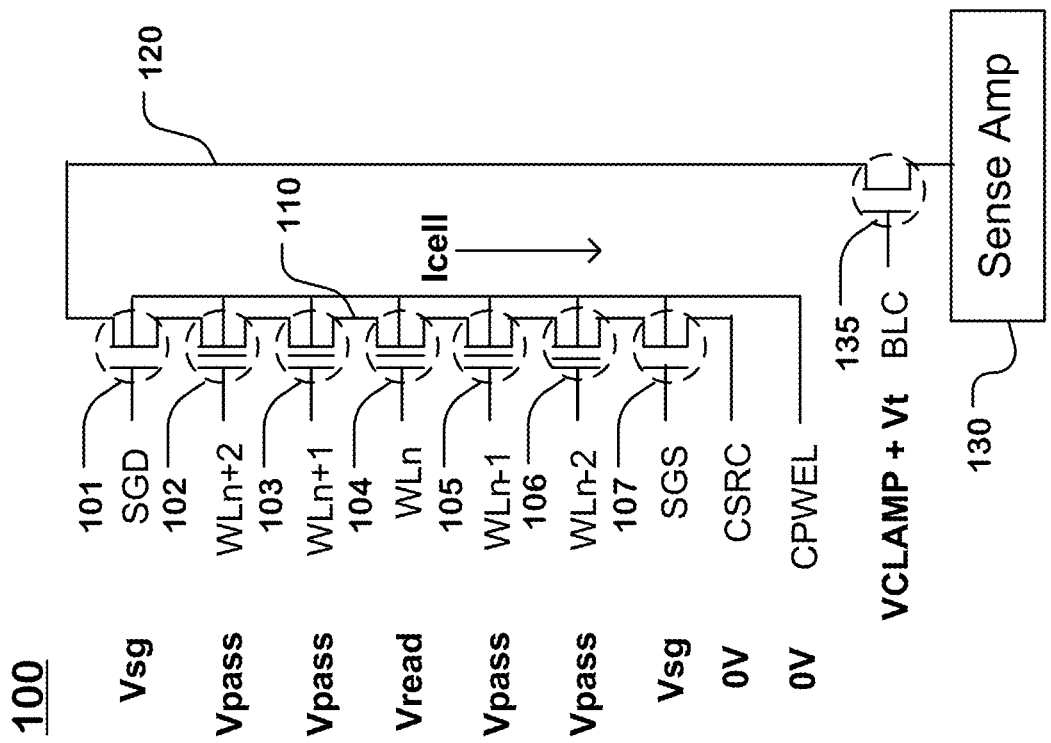
FIG. 1A is an example schematic diagram of a circuit suitable for use in performing a read operation on a selected memory cell in a NAND string.

FIG. 1A is an example schematic diagram of a circuit 100 suitable for use in performing a read operation on a selected memory cell in a NAND string. In the illustrated example, the memory comprises a flash memory such as a high-density NAND flash memory. Other types of memory technologies can be utilized as well, including phase change memory PCM, programmable resistance memory known as ReRAM or RRAM, NOR flash memory, magnetoresistive memory, and so on.

In FIG. 1A, the selected memory cell 104 is part of a NAND string formed by local bit line BL 110 in a block of memory cells. The NAND string also includes memory cells 102, 103, 105 and 106. String select transistor 101 selectively couples the bit line BL 110 to the global bit line GBL 120 at one end of the NAND string. The gate of the string select transistor 101 is connected to a string select line SGD. Ground select transistor 107 selectively couples a second end of the NAND string to a common source line CSRC. The gate of the ground select transistor 107 is connected to a ground select line SGS. The selected memory cell 104 includes a drain terminal (D) coupled to the local bit line BL 110, a source terminal (S) coupled to a common source line CSRC, and a gate terminal coupled to a word line WLn. Gate terminals of unselected memory cells 102, 103, 105 and 106 are coupled to word lines WLn+2, WLn+1, WLn−1 and WLn−2, respectively.

Figure 11:
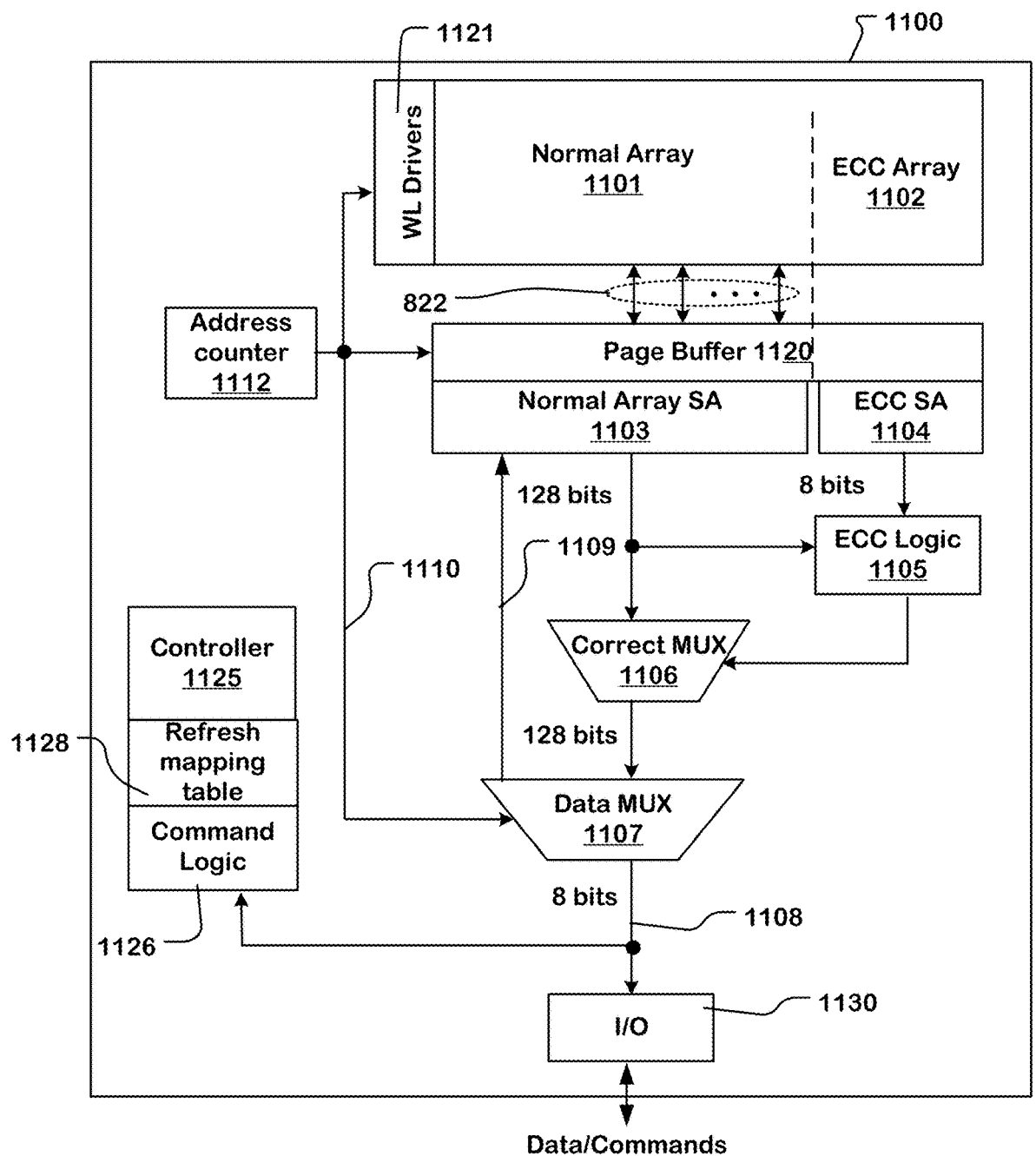
FIG. 11 is a simplified block diagram of a memory device including a memory array, and a controller for executing a refresh operation as described herein.

The global bit line GBL 120 is coupled by column decoder circuitry (not shown) to sensing circuitry 130 in a page buffer (1120, FIG. 11). A clamp circuit 135 is coupled to the global bit line GBL 120 and the sensing circuitry 130. A bit line clamp signal BLC is coupled to the gate of the clamp circuit 135, and can be provided by a controller (1125, FIG. 11) to control the timing of a read operation.

During a read operation, a read voltage Vread is applied to the gate of the selected memory cell 104; pass voltages Vpass are applied to the gates of the unselected memory cells 102, 103, 105, and 106; and a voltage Vsg is applied to the gates of the string select transistor 101 and the ground select transistor 107. A clamp bias VCLAMP can be applied at the gate of the clamp circuit 135 which has a threshold voltage of Vt. A common source line CSRC and a common P-well CPWEL can be at a ground voltage level, e.g. 0V. Cell current Icell can flow through the local bit line BL 110.

FIG. 1B illustrates example distributions of threshold voltages Vt of memory cells as can occur in NAND flash memory for example. FIG. 1B illustrates a first distribution 141 of threshold voltages Vt of memory cells having data '1', and a second distribution 142 of threshold voltages Vt of memory cells having data '0'. A sensing window 143 separates the first and second distributions 141 and 142. When pass voltages Vpass are applied to the gates of the unselected memory cells, read disturb can be induced by weak FN (Fowler-Nordheim) tunneling. Read disturb can broaden the first and second distributions of threshold voltages Vt of memory cells to cause errors when memory cells are read. For example, read disturb can cause the threshold voltage Vt of a memory cell having data '1' to erroneously increase to a voltage level higher than the first distribution 141 so the threshold voltage Vt may be read as data '0'. For example, read disturb can cause the threshold voltage Vt of a memory cell having data '0' to erroneously decrease to a voltage level lower than the second distribution 142 so the threshold voltage Vt may be read as data '1'.

A memory block in a memory device may have a few error bits, i.e., a few memory cells having threshold voltages disturbed so data stored in the memory cells are read out in error. Error correcting codes (ECCs) embedded with the memory device can be used by ECC logic on the chip or off the chip to correct error bits as the data is transferred off chip, up to a maximum number of correctible error bits in a memory block. ECC logic on the chip or off the chip can also produce ECC status and provide the ECC status to the host (210, FIG. 2). ECC status can include information such as a count of the number of corrected error bits in the data being fetched. The host can use the ECC status to determine whether the number of correctible error bits in a memory block are close to a maximum number of correctible error bits, and to decide whether to issue a refresh command sequence. A refresh threshold number of correctible error bits less than a maximum number of correctible error bits can be pre-determined. If the number of correctible error bits in a particular memory block is greater than or equal to the refresh threshold number of correctible error bits, then the particular memory block is defined by the host as a risky memory block that needs to be refreshed. A memory block can include multiple ECC units, and can be defined as a risky memory block if the number of correctible error bits in at least one of the multiple ECC units in a memory block is greater than or equal to the refresh threshold number of correctible error bits. For example, if ECC logic (222, FIG. 2) of a memory device can correct 8 error bits in a memory block, i.e., a maximum number of correctible error bits is 8, and a refresh threshold number of correctible error bits is 6, then when the number of correctible error bits of a particular memory block, or the number of correctible error bits in at least one of the multiple ECC units in a particular memory block is greater than or equal to 6, the particular memory block is defined as a risky memory block and needs to be refreshed.

As used herein, a risky memory block refers to a memory block that satisfies parameters set in the control logic, such as a memory block where all error bits in it are still correctible by ECC, but the number of correctible error bits approaches a refresh threshold number of correctible error bits. Without a refresh operation executed on the risky memory block, data in the risky memory block may be lost. With a refresh operation executed on the risky memory block, data in the risky memory block can be saved.

Figures 2, 2A:
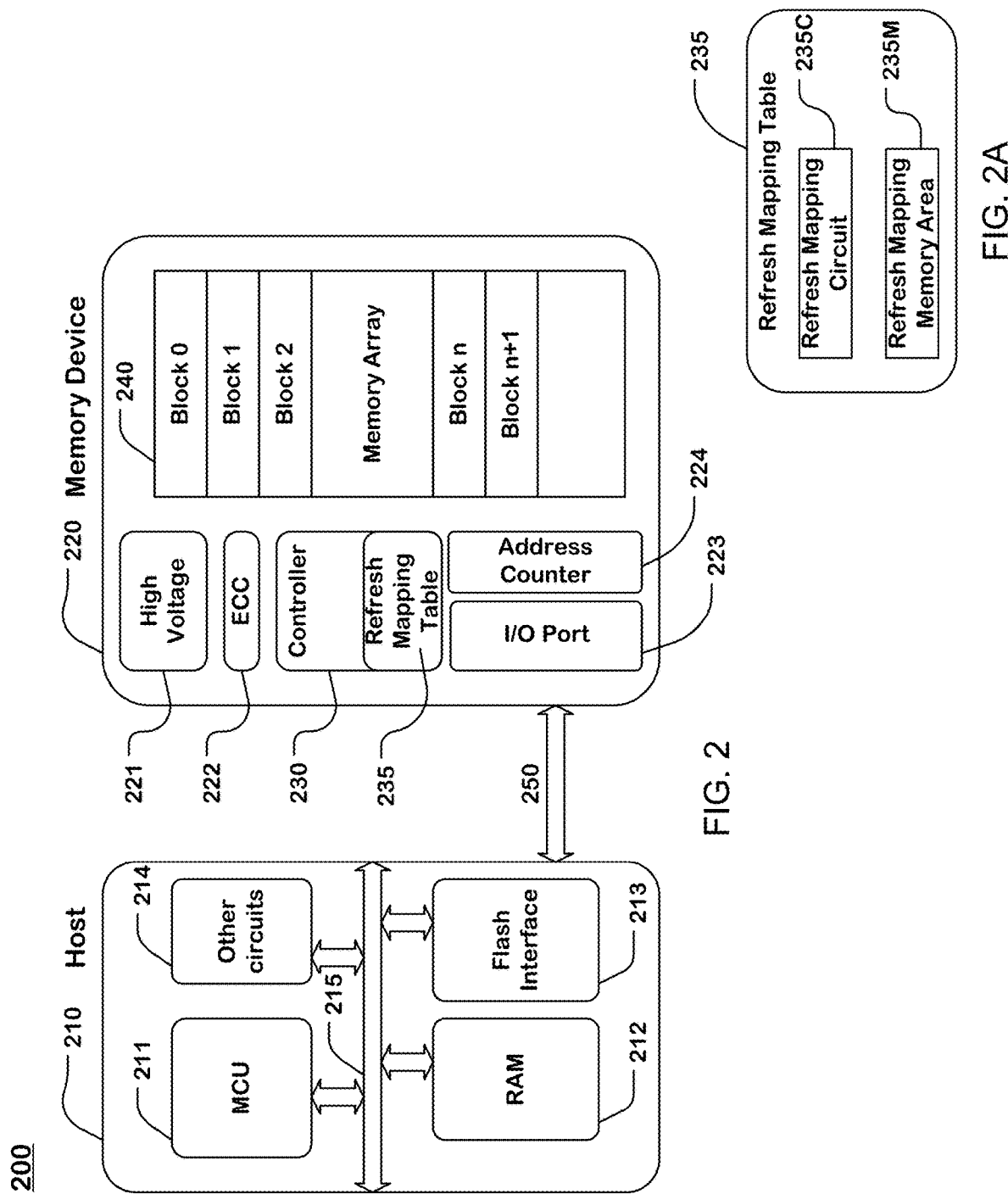
FIG. 2 is a simplified system diagram of a system including a memory device comprising a refresh mapping table and a host coupled to the memory device.
FIG. 2A is an enlarged view of a refresh mapping table as shown in FIG. 2.

FIG. 2 is a simplified system diagram of a system 200 including a memory device comprising a refresh mapping table and a host coupled to the memory device. For instance, a memory device 220 can be a Flash memory which is a non-volatile memory chip. The memory device 220 can be a single integrated circuit, or can comprise a multichip module, in which more than one chip is packaged in a multichip module.

As shown in the example of FIG. 2, a host 210 external to a memory device 220 can include a microcontroller unit MCU 211, which can include one or more processor cores CPUs (central processing unit). The MCU can communicate with a number of devices via a bus subsystem 215. A number of devices can include a storage subsystem 212, a Flash memory interface 213, and other circuits 214. A Flash memory interface 213 provides an interface between the host and a memory device 220 via a bus 250 connecting the host and the memory device. For instance, a command sequence for a read operation or a refresh operation can be transmitted from the host 210 to the memory device 220 via a bus 250, and ECC corrected data and ECC status of the data can be transmitted from the memory device 220 to the host 210 via a bus 250.

As shown in the example of FIG. 2, a memory device 220 comprises a memory array 240 including a plurality of memory blocks (Block 0, Block 1, Block 2, . . . Block n, Block n+1) on an integrated circuit or multi-chip module. A controller 230 on the integrated circuit or multi-chip module is coupled to the memory array 240 to execute commands with addresses to access addressed memory blocks in the plurality of memory blocks.

A refresh mapping table 235 in non-volatile memory on the integrated circuit or multi-chip module is accessible by the controller 230. The refresh mapping table can have one or more entries, an entry in the refresh mapping table mapping of an address identifying an addressed memory block set for refresh to a backup block address. An addressed memory block can be a risky memory block, as described in reference to FIG. 1B. In one example, an entry mapping of an address identifying an addressed memory block can be stored in a refresh mapping memory area (235M, FIG. 2) in non-volatile memory. In an alternative example, an entry mapping of an address identifying an addressed memory block can be stored at an addressable location in the non-volatile memory outside the refresh mapping memory area. In the alternative example, upon power-on of the integrated circuit or multi-chip module, an entry outside the refresh mapping memory area can be retrieved from the addressable location and then stored in the refresh mapping memory area in the non-volatile memory.

The controller 230 is responsive to a refresh command sequence, for example from the host 210, with a refresh block address to execute a refresh operation, such as an in-place refresh operation. The refresh operation can include storing a backup copy of data from the addressed memory block having the refresh block address to a backup block, setting an entry in the refresh mapping table to map the refresh block address to the backup block, refreshing the addressed memory block having the refresh block address using data from the backup block, and resetting the entry upon completion of the refresh operation for the addressed memory block. For instance, an addressed memory block can include multiple pages with respective page addresses. A refresh command sequence can include a sequence of commands to execute a refresh operation, including page read and page program commands for respective pages in an addressed memory block, to copy a backup copy of data from pages in the addressed memory block to respective pages in a backup block on page-by-page basis. Page read and page program commands in the refresh command sequence can include input page addresses for respective pages in an addressed memory block. For instance, a refresh command sequence can include commands as described in reference to FIG. 3B, including commands to set a mapping entry in the refresh mapping table (Step 325) and to reset the mapping entry in the refresh mapping table (Step 328).

As used herein, an in-place refresh operation is a memory refresh operation on an addressed memory block in a memory device that writes data from the addressed memory block back to the same addressed memory block, using an L2P (a logical address to physical address mapping table) that remaps the addressed memory block to a backup block. There is a possibility that a refresh operation may be interrupted before completion, in which case the validity of the data in the addressed block may be compromised.

The controller 230 is configured to execute a procedure to recover from an interrupt to scan the refresh mapping table 235 for a set entry upon power-on of the memory device, to complete the refresh operation for the addressed memory block identified in the set entry, and to reset the set entry upon completion of the refresh operation. The host can read out the data at the correct address mapped by the set entry. The controller 230 can use a bias arrangement state machine to control the application of biasing arrangement supply voltages 221, such as read, erase and program voltages.

ECC (Error Correcting Code) logic 222 on the memory device 220, or off the memory device, can correct error bits on and check ECC status for the data being fetched from an input block address. Depending on results of checking the ECC status, it can be determined whether to register a refresh command sequence for a refresh operation at the input block address in the memory device, as further described in reference to FIG. 3A. The ECC status can be provided to a host (210, FIG. 2), and in response, the host can issue a refresh command sequence.

Input/output port 223 can receive commands from the external host 210, and is coupled to the controller 230. Commands from the external host can be decoded and applied to the controller 230 on the memory device.

The memory device 220 includes an address counter 224 or other address logic, that is used to provide addresses to the memory array 240. The address counter 224 can be controlled by an on-chip controller 230.

FIG. 2A is an enlarged view of a refresh mapping table as shown in FIG. 2. As shown in FIG. 2A, a refresh mapping table can include a refresh mapping circuit 235C and a refresh mapping memory area 235M. Refresh mapping circuit 235C can include a mapping function circuit and registers to register information including an address of an addressed memory block and an address of a backup block for read, program, and erase operations on a memory array (1101, FIG. 11) in a memory device (1100, FIG. 11). A refresh mapping memory area 235M can store information including an address of an addressed memory block and an address of a backup block for read, program, as further described in reference to FIGS. 4A-4G.

Information registered by refresh mapping circuit 235C can be volatile. Information stored in a refresh mapping memory area 235M can be non-volatile. In one embodiment, a refresh mapping memory area 235M can be implemented in an addressable area in non-volatile memory (1101, FIG. 11) on the integrated circuit or multi-chip module accessible by the controller (1125, FIG. 11). In an alternative embodiment, a refresh mapping memory area of a refresh mapping table can be implemented off-chip.

Figures 3A, 3B:
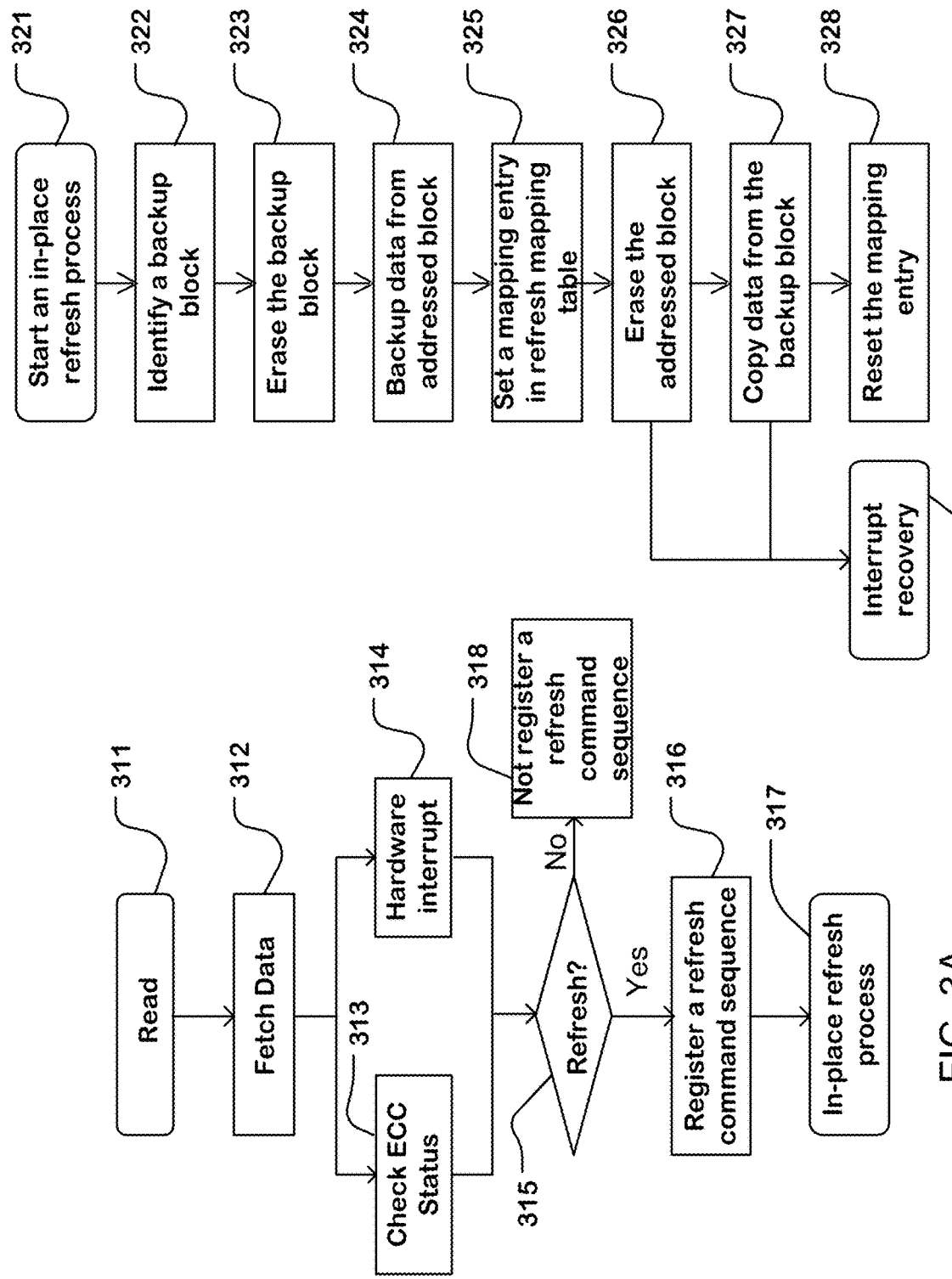
FIG. 3A illustrates an example flowchart for reading a memory device by a host external to a memory device.
FIG. 3B illustrates an example flowchart for executing an in-place refresh operation by a host external to a memory device comprising a refresh mapping table.

FIG. 3A illustrates an example flowchart for reading a memory device by a host external to a memory device. At Step 311, a host (210, FIG. 2) can issue a read command sequence with an input block address for fetching data from the memory device at the input block address, for example prior to executing an in-place refresh operation as described in reference to FIG. 3B. At Step 312, data at the input block address is fetched from the memory device to the host. At this step, ECC (Error Correcting Code) logic on the chip (222, FIG. 2) or off the chip can correct error bits as the data is fetched, and provide ECC status to the host along with corrected data. ECC status can include information such as a count of the number of corrected error bits in the data being fetched or which bits have been corrected. At Step 313, the host checks ECC status as provided at Step 312 for the fetched data on the input block address. At Step 314, a hardware interrupt may occur on the memory device. For example, a hardware interrupt can be a power outage that can interrupt a read operation before completion, in which case the validity of the data in the addressed block may be compromised. Depending on results of checking the ECC status or whether a hardware interrupt occurs, at Step 315, it is determined whether to register a refresh command sequence for a refresh operation at the input block address in the memory device.

If it is determined to not register a refresh command sequence (Step 315. No), then the read operation can proceed without registering a refresh command sequence (Step 318). If it is determined to register a refresh command sequence (Step 315. Yes), then the host can proceed to register a refresh command sequence with the input block address in the host at Step 316, including registering the input block address as the refresh block address in the host. At Step 317, the host can execute an in-place refresh operation at the input block address in the memory device, as further described in reference to FIG. 3B. For instance, the host (210, FIG. 2) can register a refresh command sequence along with an input block address registered as the refresh block address in a storage subsystem (212, FIG. 2). By registering a refresh command sequence, a refresh operation can be deferred until at least a current read operation is completed, so as not to impact the current read operation. The host can issue a registered refresh command sequence to the memory device when there is no on-going read operation.

FIG. 3B illustrates an example flowchart for executing an in-place refresh operation by a host external to and coupled to a memory device comprising a refresh mapping table. The flowchart includes example commands in a refresh command sequence that a host can issue to the memory device to execute an in-place refresh operation. The memory device comprises a memory including a plurality of memory blocks on an integrated circuit or multi-chip module, and a refresh mapping table in non-volatile memory on the integrated circuit or multi-chip module. The refresh mapping table has one or more entries, an entry in the refresh mapping table mapping of an address identifying an addressed memory block set for refresh to a backup block address. An addressed memory block can be a risky memory block, as described in reference to FIG. 1B.

As shown in the example of FIG. 3B, at Step 321, a host (210, FIG. 2) starts an in-place refresh operation. At Step 322, the host identifies a backup block in a plurality of memory blocks on an integrated circuit or multi-chip module. At Step 323, the host can issue a command to a memory device (220, FIG. 2) to erase the backup block as identified at Step 322. At Step 324, the host can issue a command with an input address to the memory device to store a backup copy of data from the addressed memory block at the refresh block address. The command to erase the backup block at Step 323 is issued by the host prior to the command to store the backup copy in the backup block at Step 324.

At Step 325, the host can issue a command with a refresh block address to the memory device to set a mapping entry in the refresh mapping table to map the refresh block address to an address of the backup block. In response to this command, a controller in the memory device can store the mapping entry in a refresh mapping memory area (235M, FIG. 2), and register the mapping entry in refresh mapping circuit (235C, FIG. 2) in a refresh mapping table. At Step 326, the host can issue a command to the memory device to erase the addressed memory block at the refresh block address. At Step 327, the host can issue a command to the memory device to copy the backup copy from the backup block to the addressed memory block at the refresh block address. At Step 328, the host can issue a command to the memory device to reset the mapping entry in the refresh mapping table upon completion of the refresh operation for the addressed memory block at the refresh block address. In response to this command, a controller in the memory device can update a refresh mapping memory area (235M, FIG. 2) and refresh mapping circuit (235C, FIG. 2) in a refresh mapping table to reset the mapping entry.

At Step 330, the host can issue commands to the memory device to start interrupt recovery, such as recovering from a power loss. An interrupt can occur during erasing the addressed memory block (Step 326) or during copying the backup copy from the backup block to the addressed memory block (Step 327). Interrupt recovery is further described in reference to FIG. 3C.

Figures 3C, 3D, 3E:
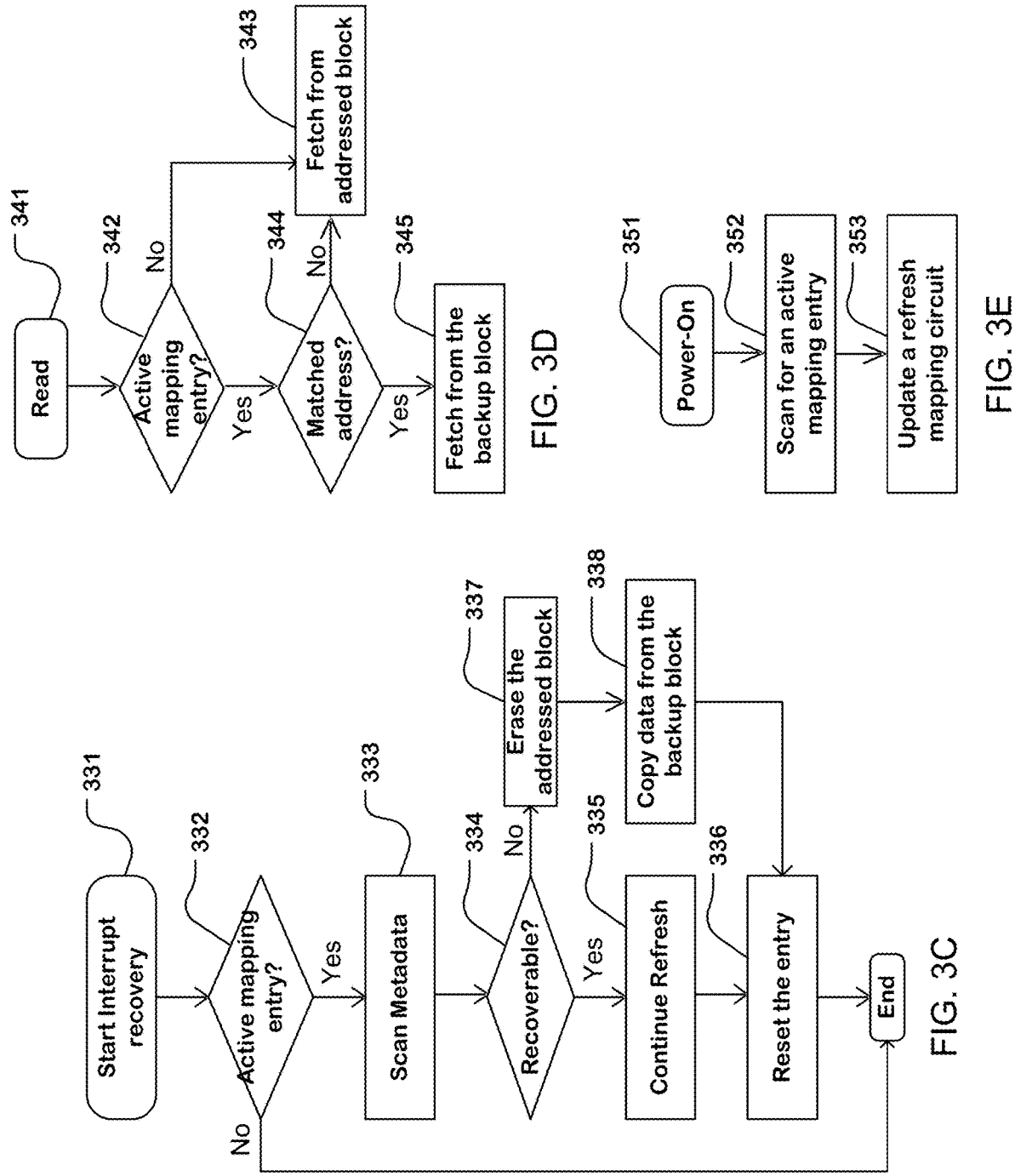
FIG. 3C illustrates an example flowchart for executing a power loss recovery procedure in a memory device comprising a refresh mapping table.
FIG. 3D illustrates an example flowchart for reading a memory device comprising a refresh mapping table.
FIG. 3E illustrates an example flowchart for a power-on procedure by a controller in a memory device.

FIG. 3C illustrates an example flowchart for a host to execute a power loss recovery procedure in a memory device comprising a refresh mapping table. A host can execute a recovery procedure after the memory device is successfully powered on. As shown in the example of FIG. 3C, at Step 331, a host in a memory device can start a procedure to recover from an interrupt such as a power loss upon power-on of the memory device. An interrupt can occur during erasing the addressed memory block (Step 326, FIG. 3B; Step 624, FIG. 6) or during copying the backup copy from the backup block to the addressed memory block (Step 327, FIG. 3B; Step 625, FIG. 6).

At Step 332, the host can issue a command to the memory device to check the active mapping entry status from a refresh mapping circuit (235C, FIG. 2) in the refresh mapping table (235, FIG. 2). If there is no active mapping entry registered with the refresh mapping circuit, then the recovery procedure ends (Step 332. No). If there is an active mapping entry registered with the refresh mapping circuit (Step 332. Yes), then the recovery procedure can proceed to Step 333. At Step 333, the host can scan metadata in the memory, e.g. a storage subsystem (212, FIG. 2), for status of a copying operation started before an interrupt, such as described in reference to Step 327 in FIG. 3B. The host writes the metadata in the memory to record the progress of the refresh process. Based on the status of the copying operation, at Step 334, it is determined whether the copying operation is recoverable. If yes (Step 334. Yes), then at Step 335, the copying operation can continue and the refresh operation can complete for the addressed memory block identified in the set entry. At Step 336, the entry in the refresh mapping table is reset upon completion of the refresh operation for the addressed memory block.

If the copying operation is not recoverable (Step 334. No), then at Step 337, the host can issue a command to the memory device to erase the addressed memory block, and at Step 338, the host can issue a command to the memory device to copy the backup copy from the backup block to the addressed memory block. At Step 336, the host can issue a command to the memory device to reset the entry in the refresh mapping table upon completion of the refresh operation for the addressed memory block.

FIG. 3D illustrates an example flowchart for reading a memory device comprising a refresh mapping table. At Step 341, a controller in the memory device can receive a read command with an input block address. At Step 342, the controller determines if an active mapping entry is registered by the refresh mapping circuit (235C, FIG. 2A) in the refresh mapping table. If an active mapping entry is registered (Step 342. Yes), then at Step 344, the controller determines if the input block address matches a refresh block address in the active mapping entry. If the input block address matches a refresh block address, then at Step 345, the controller can fetch data from the backup block according to the active mapping entry corresponding to the input block address. If an active mapping entry is not registered (Step 342. No) or if the input block address does not match (Step 344. No) a refresh block address, then at Step 343, the controller can fetch data from an addressed block at the input block address.

FIG. 3E illustrates an example flowchart for a power-on procedure by a controller in a memory device. A controller (1125, FIG. 11) in the memory device is configured to execute a power-on procedure to restore mapping of a refresh block address to a backup block address after an interrupt, upon power-on of the memory device. At Step 351, a power-on procedure starts on a memory device. At Step 352, the controller can scan the refresh mapping table for a set entry, also referred to as an active mapping entry. In one embodiment where a refresh mapping table including a journal format table (FIGS. 4A-4G), the controller can scan the journal format table for an active mapping entry. In an alternative embodiment where a refresh mapping table includes a backup block list that registers a set of backup blocks (FIGS. 5, 5A, 5B, 5C), a controller can scan a refresh mapping memory area (235M, FIG. 2A) for active backup blocks, and scan the active backup blocks for an active mapping entry.

At Step 353, the controller can register the set entry in the refresh mapping table. A refresh mapping table (235, FIG. 2A) includes a refresh mapping memory area (235M, FIG. 2A) storing mapping entries, and a refresh mapping circuit (235C, FIG. 2A) registering the set entry mapping the refresh block address to the backup block. Scanning the refresh mapping table for a set entry includes scanning a refresh mapping memory area in a refresh mapping table. Registering the set entry in the refresh mapping table includes registering the set entry in a refresh mapping circuit in the refresh mapping table.

After the power-on procedure is executed, a set entry or an active mapping entry is already in the refresh mapping table (235, FIG. 2), so the host can access the active mapping entry directly, using the same refresh block address. For instance, if a boot code block of a memory device needs refresh and there is a sudden power loss during a refresh period, then the next time the memory device is powered on, the power-on procedure is executed and the host can still use the same refresh block address of the boot code block to boot the memory device. Without the technology described herein including the power-on procedure, if a boot code block of a memory device needs refresh and there is a sudden power loss during a refresh period, the memory system cannot boot the next time the memory device is powered on, because there is no correct boot code in the original boot code block.

FIGS. 4A-4G illustrate an embodiment of a refresh mapping table including a journal format table. In this embodiment, the host keeps a list of backup blocks. To set an entry in the refresh mapping table, the host needs to issue a command sequence with both an address of a backup block and an address of an addressed block. During a power-on period of a memory device, a controller (1125, FIG. 11) in the memory device can search a refresh mapping memory area (235M, FIG. 2A) for an active mapping entry, and update a refresh mapping circuit with the active mapping entry. After the power-on, an active mapping entry is already in the refresh mapping table (235, FIG. 2), so the host can access the active mapping entry directly. In this embodiment, a refresh mapping memory area (235M, FIG. 2A) in a refresh mapping table (235, FIG. 2) comprises a journal format table. Setting an entry includes writing a valid entry or an active flag in the journal format table. Resetting the entry includes marking the entry invalid or writing an inactive flag in the journal format table. Setting an entry can also include writing an address of an addressed memory block and an address of a backup block in a refresh mapping memory area (235M, FIG. 2A), and updating a refresh mapping circuit (235C, FIG. 2A), for example, to register an address of an addressed memory block and an address of a backup block. Resetting an entry can also include updating a refresh mapping circuit (235C, FIG. 2A), for example, to deregister an address of an addressed memory block and an address of a backup block that were registered during an operation to set an entry.

As shown in the example of FIGS. 4A-4G, a refresh mapping area can include a first memory area ("Area 1") and a second memory area ("Area 2"). For instance, a memory area, e.g. a first memory area or a second memory area, can be a block of memory cells in a NAND flash memory, which is a type of non-volatile storage technology that does not require power to retain data. A NAND flash memory is erased in blocks of memory cells, so one memory cell in a block of memory cells cannot be erased without erasing all the memory cells in the block.

As shown in the example of FIGS. 4A-4G, only one entry in a refresh mapping memory area can be set or marked valid at a time, as indicated by "S". Although alternatively, two or more entries in a refresh mapping memory area can be set or marked valid at a time. As shown in FIG. 4A, 5 entries 410 are reset or marked invalid or have an inactive flag in a first memory area in a refresh mapping area, as indicated by "C". As shown in FIG. 4B, a new entry 416 is set or marked valid or has an active flag in the first memory area, as indicated by "S". Setting a new entry 416 can also include writing an address of an addressed memory block and an address of a backup block in the first memory area.

As shown in FIG. 4C, the first memory area is full as all entries in it have been reset or marked invalid, as indicated by "C", except for the last entry 417 in the first memory area. A memory area where entries can be set can be referred to as an active area. During operation, one memory area in two or more memory areas in a refresh mapping area is active, while other memory area(s) in the refresh mapping area is(are) inactive. As shown in FIG. 4D, the first memory area that has become full as shown in FIG. 4C is closed, as indicated by a flag "E" in the last entry in the first memory area.

As shown in FIG. 4E, the second memory area has become the active memory area, and a new entry 420 is set or marked valid in the second memory area in the refresh mapping table. Setting a new entry 420 can also include writing an address of an addressed memory block and an address of a backup block in the second memory area. As shown in FIG. 4F, the closed first memory area in the refresh mapping area is erased, so it can be used as the active memory area when the second memory area becomes full. As shown in FIG. 4G, a new entry 430 is set or marked valid in the second memory area in the refresh mapping area.

When the second memory area becomes full, i.e., all entries in it have been reset or marked invalid, the second memory area can be closed, the first memory area can become active, and a new entry can be set or marked valid in the first memory area.

FIG. 5 illustrates an alternative embodiment of a refresh mapping table storing a backup block list that registers a set of backup blocks (e.g. Backup Block 0, Backup Block 1, Backup Block 2) and activation status (e.g. inactive, active) of backup blocks in the set of backup blocks, with the entries stored inside corresponding backup blocks in the set of backup blocks. In this alternative embodiment, a refresh mapping memory area (235M, FIG. 2A) can include the corresponding backup blocks in the set of backup blocks (e.g. Backup Block 0, Backup Block 1, Backup Block 2), with the entries stored inside each active backup block. In this embodiment, each backup block (e.g. Backup Block 0) in the set of backup blocks has a data area for storing data copied from an addressed block, and a reserved area for writing an address of an addressed block and an active flag. Initialization of a backup block list stored in a refresh mapping table is described in reference to FIG. 5B. Setting an entry can include writing an address of an addressed block and an active flag in an available block in the set of backup blocks, as further described in reference to FIG. 5C. Resetting the entry can include erasing the backup block, as further described in reference to FIG. 5C. Resetting the entry can include erasing at least the active flag or writing an inactive flag in the block, as further described in reference to FIG. 7A.

An available block in the set of backup blocks (e.g. Backup Block 0, Backup Block 1, Backup Block 2) refers to a block available to store a backup copy of data from an addressed memory block. An available block can also be referred to as an active block. For instance, an available backup block in the set of backup blocks can be the last backup block (e.g. Backup Block 2) in the set of backup blocks. When an entry is set in an available block in the set of backup blocks, an active flag and the address of the addressed block can be written in the available block. When an entry is reset in a block in the set of backup blocks, the active flag can be erased in the block or an inactive flag can be written in the block. The backup block list includes multiple slots and each of the multiple slots contains information of one backup block. Slots in the backup block list for deregistered blocks are indicated with "inactive" in FIG. 5. A slot in the backup block list for an available block is indicated with "active" in FIG. 5. The slots that are not used are indicated with "Empty" in the backup block list.

FIG. 5A illustrates an example flowchart for a power-on procedure by a controller in a memory device that includes an alternative embodiment of a refresh mapping table as shown in FIG. 5. At Step 551, a power-on procedure starts on a memory device. At Step 552, a controller (1125, FIG. 11) can scan a refresh mapping memory area (235M, FIG. 2A) in a refresh mapping table (235, FIG. 2) for active backup blocks, also referred to as available backup blocks. At Step 553, the controller can scan the active backup blocks for an active mapping entry, also referred to as a set mapping entry. At Step 554, the controller can update a refresh mapping circuit (235C, FIG. 2A) with the active mapping entry. Subsequently, data stored in the active backup block can be fetched and copied to an addressed memory block according to the active mapping entry.

An available backup block can be used many times until it is worn out, and then another backup block in the set of backup blocks can be used as a new available backup block.

FIG. 5B illustrates initialization of a backup block list registering a set of backup blocks, where the backup block list is stored in a refresh mapping table and includes activation status of backup blocks in the set. A refresh mapping memory area (235M, FIG. 2A) includes the set of backup blocks registered by the backup block list, as described in reference to FIG. 5. To initialize a backup block list, the host issues a command sequence with an address 501A of a backup block (Backup Block 0) to a memory device, to register the backup block in a refresh mapping memory area. Registering a backup block can include writing an address 501A of a backup block (Backup Block 0) in the backup block list, and updating a refresh mapping circuit (235C, FIG. 2A) with the address of the backup block. An active flag 501F can also be written in the backup block list in a refresh mapping table.

FIG. 5C illustrates the data arrangement in a backup block in a first embodiment. In this embodiment, a backup block 520 in the set of backup blocks has a data area 521 for storing data copied from an addressed block, and a reserved area 522 for writing an address 523 of an addressed block and an active flag 524. To set an entry in the refresh mapping table, the host issues a command sequence with an address of an addressed block. During a power-on period of a memory device, a controller (1125, FIG. 11) in the memory device can search a refresh mapping memory area (235M, FIG. 2A) for active backup blocks, check the activation flag information (active or inactive) in the active backup blocks for an active mapping entry, and update a refresh mapping circuit (235C, FIG. 2A) with the active mapping entry. After the power-on, an active mapping entry is already in the refresh mapping table (235, FIG. 2), so the host can access the active mapping entry directly. In this embodiment, setting an entry can include writing the address of the addressed block and an active flag in a reserved area in an available backup block in the set of backup blocks. Resetting the entry can include erasing the backup block including erasing the reserved area to a blank pattern. Erasing the backup block can be executed when the host issues a block erase command to the memory device, so a specific reset command sequence to reset the entry is not needed. Resetting the entry can include updating a refresh mapping circuit (235C, FIG. 2A), for example, to deregister an address of an addressed memory block that was registered during an operation to set an entry.

Figure 6:
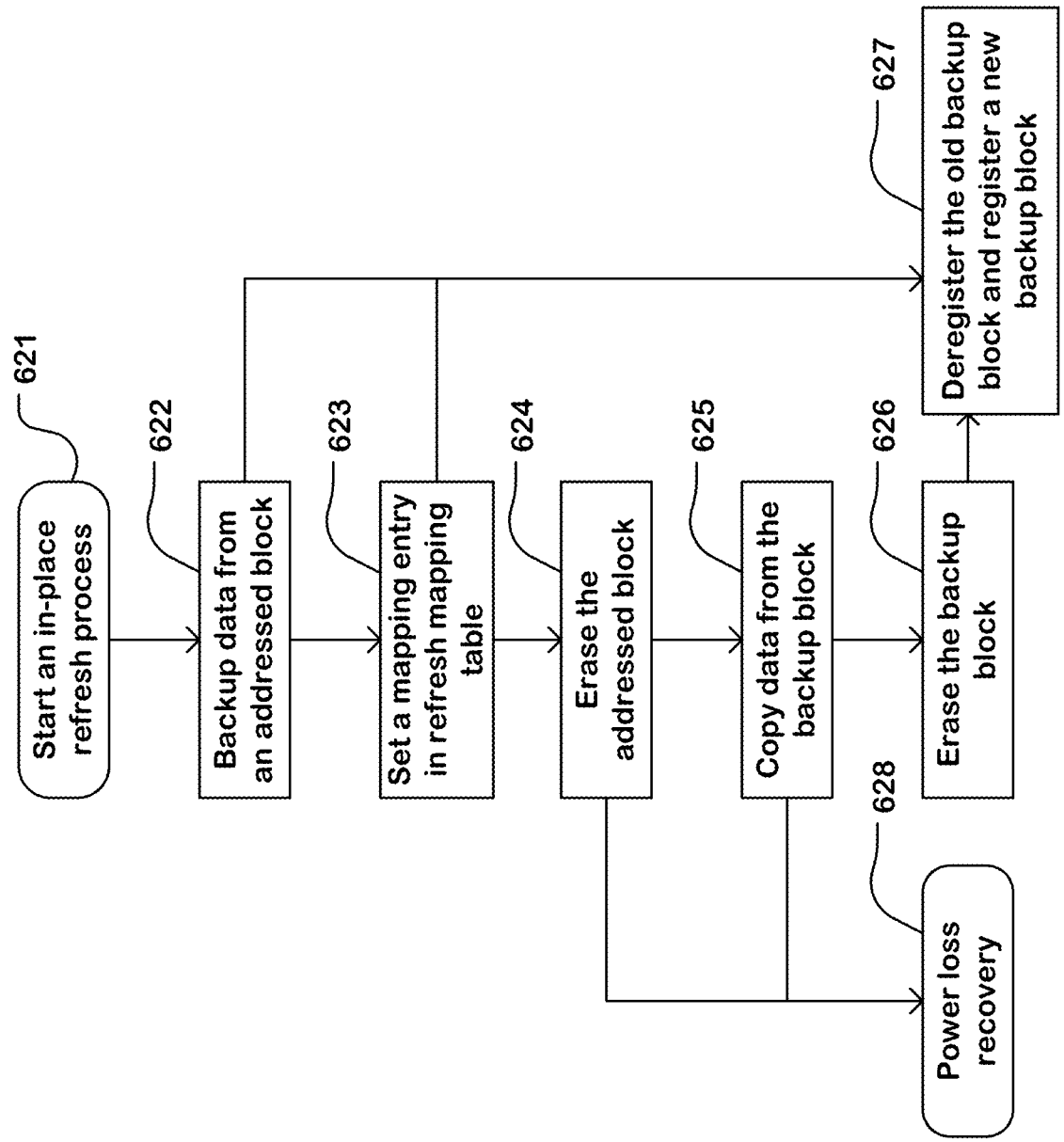
FIG. 6 illustrates an example flowchart for operating a memory device comprising an alternative embodiment of a refresh mapping table as in FIG. 5.

FIG. 6 illustrates an example flowchart for operating a memory device comprising an alternative embodiment of a refresh mapping table as in FIG. 5. As described for FIG. 5, in this alternative embodiment of a refresh mapping table, a backup block list registers a set of backup blocks and activation status of backup blocks in the set of backup blocks. A refresh mapping memory area (235M, FIG. 2A) includes the set of backup blocks, with the entries stored inside corresponding backup blocks in the set of backup blocks. Setting an entry can include writing an address of an addressed block and an active flag in an available block in the set of backup blocks. Resetting the entry can include erasing the active flag in the block. Resetting the entry can include erasing the backup block.

As shown in the example of FIG. 6, at Step 621, a host (210, FIG. 2) starts an in-place refresh operation. At Step 622, the host can issue a command with a refresh block address to a memory device (220, FIG. 2) to store a backup copy of data from the addressed memory block at the refresh block address, to a backup block, such as an available backup block ("Backup Block 2", FIG. 5) in the set of backup blocks. An addressed memory block can be a risky memory block, as described in reference to FIG. 1B.

At Step 623, the host can issue a command to the memory device to set a mapping entry in the refresh mapping table. In response to this command, a controller can write an active flag in the active block, and write the address of the addressed memory block in the active block.

At Steps 624 and 625, the addressed memory block at the refresh block address can be refreshed using data from the available backup block. At Step 624, the host can issue a command to the memory device to erase the addressed memory block at the refresh block address. At Step 625, the host can issue a command to the memory device to copy the backup copy from the backup block to the addressed memory block at the refresh block address.

At Step 626, the host can issue a block erase command to the memory device to erase the backup block in the refresh mapping memory area (235M, FIG. 2A) in the refresh mapping table, thereby resetting the mapping entry in the refresh mapping memory area. In response to the command, a controller can erase the backup block including an active flag.

When the backup block is erased (Step 626), or upon failure to store a backup copy of data from the addressed memory block to the backup block (Step 622), or upon failure to set a mapping entry in the refresh mapping table (Step 623), at Step 627, the host can issue a command to the memory device to deregister the old backup block and register a new backup block. The failure at Step 622 or Step 623 can be caused by the old backup block being worn out. Step 627 is further described in reference to FIGS. 6A-6B.

Step 628 refers to interrupt recovery, such as recovering from a power loss, where an interrupt can occur during erasing the addressed memory block (Step 624) or during copying the backup copy of data from the backup block to the addressed memory block (Step 625). Upon power-on of a memory device, a controller in the memory device can scan for an active backup block in a list of backup blocks and for an active mapping entry in a reserved area of the active mapping entry. The active mapping entry can be stored in a refresh mapping circuit (235C, FIG. 2A) in a refresh mapping table, so it is ready to be used by a block mapping operation using a refresh mapping table as described in reference to FIG. 3D.

FIGS. 6A-6B illustrate deregistering an old backup block and registering a new backup block in a backup block list stored in a refresh mapping table (235, FIG. 2). FIG. 6A illustrates results of deregistering an old backup block (Backup Block 0) having a backup block address 541A. A host can issue a command to a memory device to deregister an old backup block, for example when the old backup block is worn out. Deregistering an old backup block can include writing an inactive flag 541F for the old backup block (Backup Block 0) in the backup block list, and updating the refresh mapping circuit (235C, FIG. 2A) to disable the old backup block.

FIG. 6B illustrates results of registering a new backup block. A host can issue a command to a memory device to register a new backup block, for example when an old backup block is deregistered. Registering a new backup block (Backup Block 1) can include writing an address 542A of a backup block and an active flag 542F to the backup block list, and updating the refresh mapping circuit (235C, FIG. 2A) to enable the new backup block. An active flag can also be written in the new backup block in the refresh mapping memory area (235M, FIG. 2A). FIGS. 6A and 6B together illustrate replacing an old backup block (Backup Block 0) with a new backup block (Backup Block 1).

Figure 7:
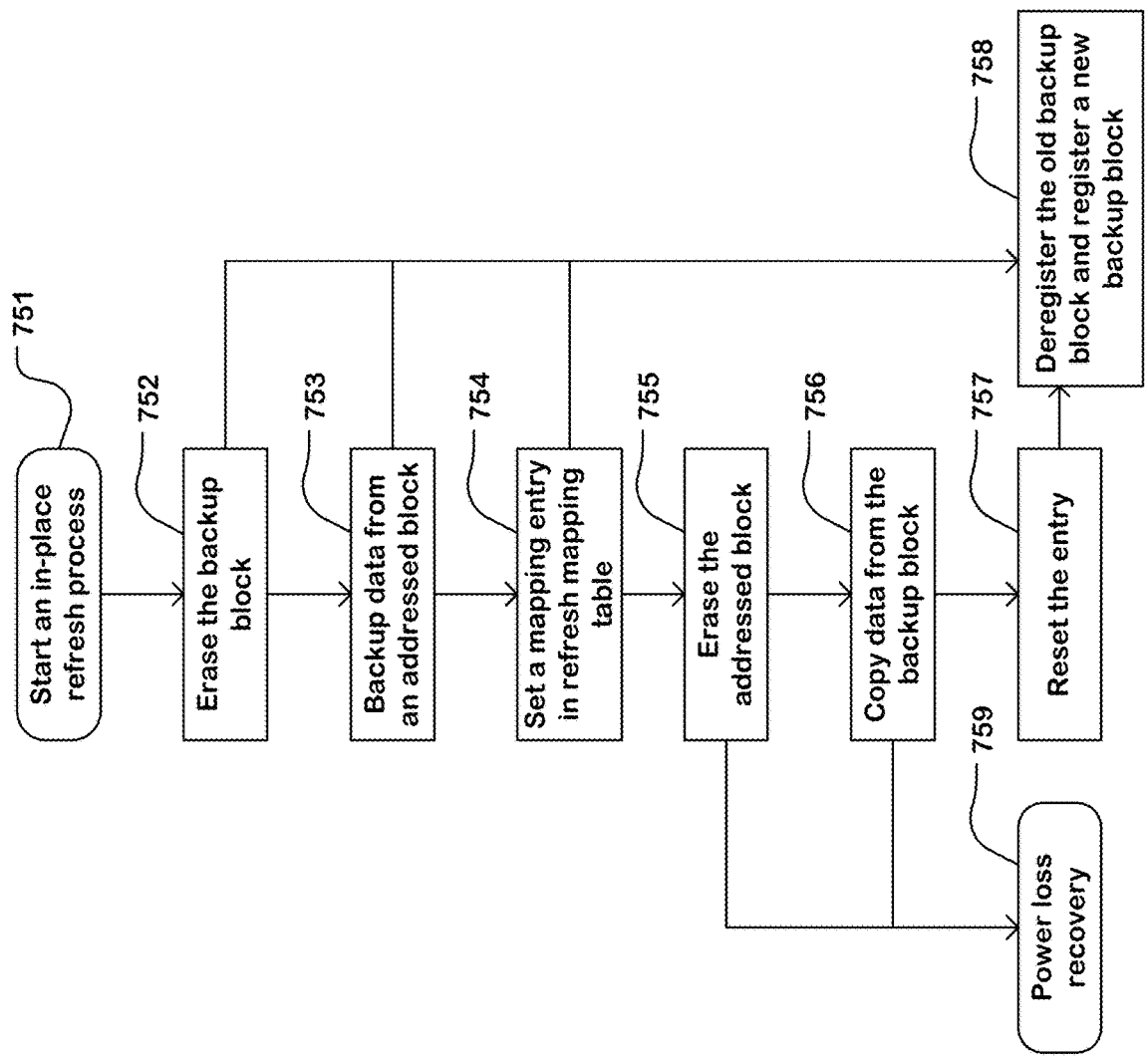
FIG. 7 illustrates an alternative flowchart for operating a memory device comprising an alternative embodiment of a refresh mapping table as in FIG. 5.

FIG. 7 illustrates an alternative flowchart for operating a memory device comprising an alternative embodiment of a refresh mapping table as in FIG. 5. As described for FIG. 5, in this alternative embodiment of a refresh mapping table, a backup block list registers a set of backup blocks and activation status of backup blocks in the set of backup blocks. A refresh mapping memory area (235M, FIG. 2A) includes the set of backup blocks, with the entries stored inside corresponding backup blocks in the set of backup blocks. Setting an entry can include writing an address of an addressed block and an active flag in an available block in the set of backup blocks. Resetting the entry can include erasing the active flag in the block or writing an inactive flag in the block.

As shown in the example of FIG. 7, at Step 751, a host (210, FIG. 2) starts an in-place refresh operation. At Step 752, the host can issue a block erase command to the memory device to erase the backup block in the refresh mapping memory area (235M, FIG. 2A). In response to the command, a controller can erase the backup block. At Step 753, the host can issue a command with a refresh block address to a memory device (220, FIG. 2) to store a backup copy of data from the addressed memory block at the refresh block address, to a backup block, such as an available backup block ("Backup Block 2", FIG. 5) in the set of backup blocks.

At Step 754, the host can issue a command to the memory device to set a mapping entry in the refresh mapping table. In response to this command, a controller can write an active flag in the active block, and write the address of the addressed memory block in the active block.

At Steps 755 and 756, the addressed memory block at the refresh block address can be refreshed using data from the available backup block. At Step 755, the host can issue a command to the memory device to erase the addressed memory block at the refresh block address. At Step 756, the host can issue a command to the memory device to copy the backup copy from the backup block to the addressed memory block at the refresh block address.

Figure 7A:
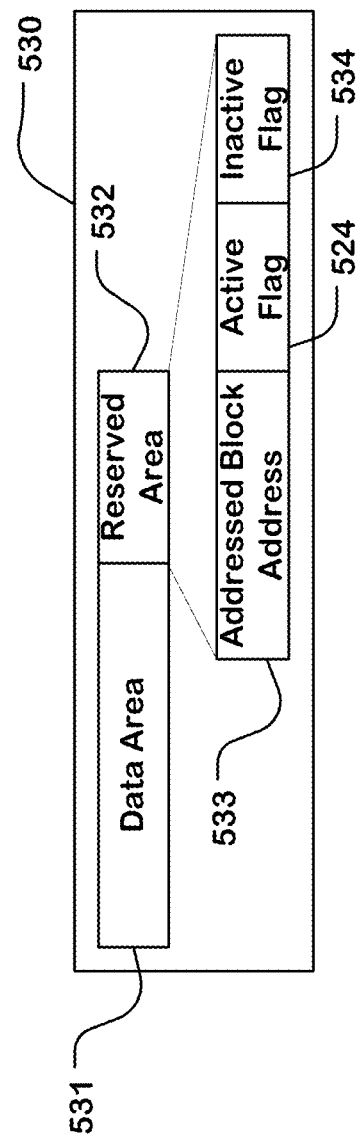
FIG. 7A illustrates the data arrangement in a backup block in a second embodiment.

At Step 757, a controller in the memory device can reset the entry for the addressed memory block, as further described in reference to FIG. 7A.

When the entry is reset (Step 757), or upon failure to erase the backup block (Step 752), or upon failure to store a backup copy of data from the addressed memory block to the backup block (Step 753), or upon failure to set a mapping entry in the refresh mapping table (Step 754), at Step 758, the host can issue a command to the memory device to deregister the old backup block and register a new backup block. The failure at Step 752, Step 753 or Step 754 can be caused by the old backup block being worn out. Step 758 is further described in reference to FIGS. 6A-6B.

Step 759 refers to interrupt recovery, such as recovering from a power loss, where an interrupt can occur during erasing the addressed memory block (Step 755) or during copying the backup copy of data from the backup block to the addressed memory block (Step 756). Upon power-on of a memory device, a controller in the memory device can scan for an active backup block in a backup block list and for an active mapping entry in a reserved area of the active mapping entry. The active mapping entry can be stored in a refresh mapping circuit (235C, FIG. 2A) in a refresh mapping table, so it is ready to be used by a block mapping operation using a refresh mapping table as described in reference to FIG. 3D.

FIG. 7A illustrates the data arrangement in a backup block in a second embodiment. In this embodiment, a backup block 530 in the set of backup blocks has a data area 531 for storing data copied from an addressed block, and a reserved area 532 for writing an address 533 of an addressed block, an active flag 524, and an inactive flag 534. Description about the first embodiment of the data arrangement in a backup block in reference to FIG. 5C is generally applicable to this embodiment, including description about setting an entry in the refresh mapping table.

One difference between this second embodiment of the data arrangement in a backup block and the first embodiment described in reference to FIG. 5C is in resetting an entry in the refresh mapping table. In this embodiment, resetting the entry can include erasing an active flag 524 or writing an inactive flag 534 in a reserved area 532 in a backup block 530, and updating a refresh mapping circuit (235C, FIG. 2A) to deregister an address of an addressed memory block that was registered during an operation to set an entry.

Figure 8A:
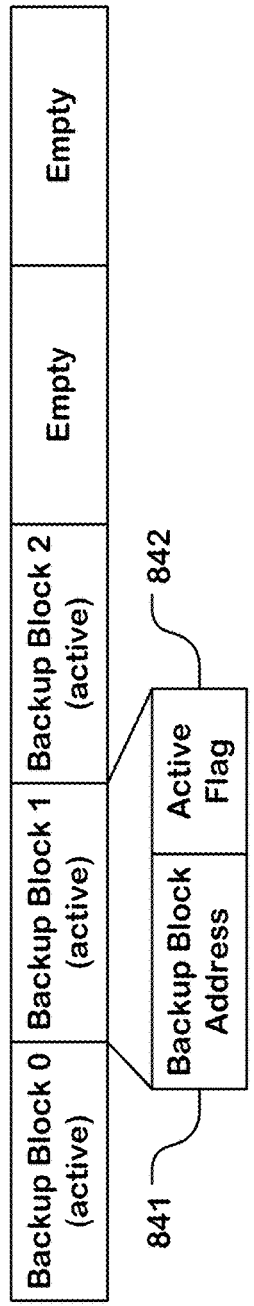
FIGS. 8A, 8B and 8C illustrate a first embodiment of a backup block list, where a backup block list can register multiple active backup blocks at a time.
Figure 8B:
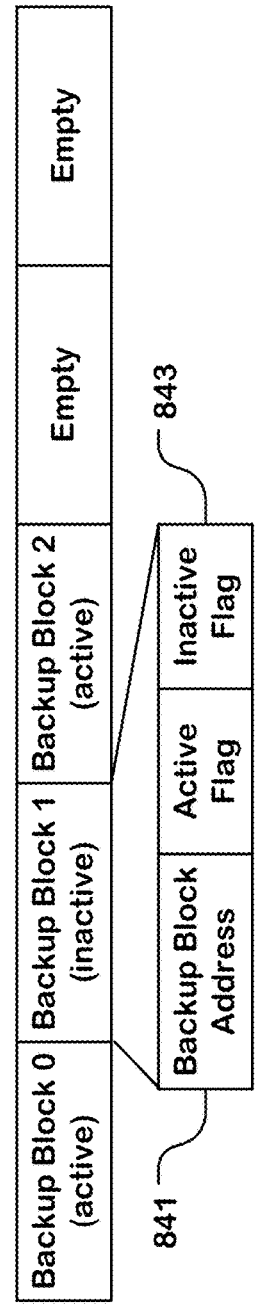
Figure 8C:
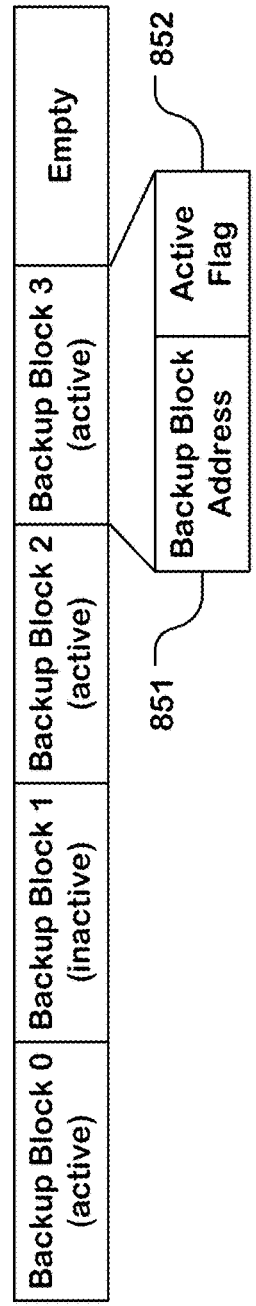

FIGS. 8A, 8B and 8C illustrate a first embodiment of a backup block list, where a backup block list can register multiple (more than one) active backup blocks at a time. FIGS. 8A-8C illustrate deregistering an old backup block and registering a new backup block in a backup block list 800 that can be stored in a refresh mapping table (235, FIG. 2). FIG. 8A illustrates a backup block list having multiple active backup blocks (Backup Blocks 0, 1, 2) initially. A backup block "Backup Block 1" registers a backup block address 841 and an active flag 842. FIG. 8B illustrates results of deregistering a backup block (Backup Block 1) by setting an invalid flag 843. A host can issue a command to a memory device to deregister an old backup block, for example when the old backup block is worn out. Deregistering an old backup block can include writing an inactive flag 843 for the old backup block (Backup Block 1) in the backup block list, and updating the refresh mapping circuit (235C, FIG. 2A) to disable the old backup block.

FIG. 8C illustrates results of registering a new backup block. A host can issue a command to a memory device to register a new backup block, for example when an old backup block is deregistered. Registering a new backup block (Backup Block 3) can include writing an address 851 of a backup block and an active flag 852 to the backup block list, and updating the refresh mapping circuit (235C, FIG. 2A) to enable the new backup block. An active flag can also be written in the new backup block in the refresh mapping memory area (235M, FIG. 2A).

FIGS. 9A, 9B and 9C illustrate a second embodiment of a backup block list, where a backup block list can register only a single active backup block at a time. In this embodiment, when a single backup block is registered to become a new single active backup block, an old single active backup block is automatically deregistered. In this embodiment, the last backup block in a backup block list 900 is the single active backup block. A host can issue a command to a memory device to register a new backup block when a memory device supports only a single active backup block at a time. FIG. 9A illustrates a backup block list 900 having a single active backup block (Backup Block 0) initially.

FIG. 9B illustrates results of registering a new backup block (Backup Block 1). Registering a new backup block can include writing an address of a new backup block to the backup block list 900, and updating the refresh mapping circuit to enable the new backup block. An active flag can also be written for the new backup block in the backup block list. In this example, the new backup block (Backup Block 1) will become the new single active backup block, and the old single active backup block (Backup Block 0) is automatically deregistered (inactive), without a specific deregister operation to deregister the old single active backup block (Backup Block 0).

FIG. 9C illustrates an example flowchart for operating a memory device comprising a second embodiment of a backup block list that registers only a single active backup block at a time, as described in reference to FIGS. 9A and 9B. FIG. 9C is similar to FIG. 6, where description for Steps 621-626 and 628 in FIG. 6 is applicable to corresponding steps in FIG. 9C. One difference is that in FIG. 9C, at Step 927, the host can issue a command to the memory device to register a new backup block, without issuing a specific deregister operation to deregister the old single active backup block. In contrast, in FIG. 6, at Step 627, the host can issue a command to the memory device to both deregister the old active backup block and register a new active backup block.

Figure 10A:
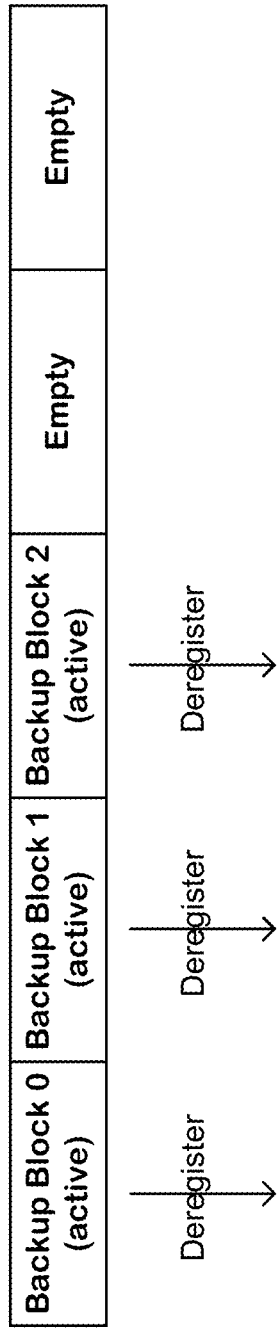
FIGS. 10A and 10B illustrate a third embodiment of a backup block list, where a backup block list can register only active backup blocks.
Figure 10B:

FIGS. 10A and 10B illustrate a third embodiment of a backup block list, where a backup block list 1000 stored in a refresh mapping table (235, FIG. 2) can register only active backup blocks (Backup Blocks 0, 1, 2, FIG. 10A), without registering any inactive backup blocks.

FIG. 10B illustrates deregistering backup blocks in a backup block list at the same time. The host can issue a command to the memory device to erase the backup block list, in order to deregister the active backup blocks registered in the backup block list. The multiple backup blocks registered in a backup block list at the same time as shown in FIG. 10A are deregistered by erasing the backup block list, as indicated by "empty" for each of the multiple active backup blocks shown in FIG. 10A.

FIG. 11 is a simplified block diagram of a memory device including a memory array, and a controller for executing a refresh operation as described herein. A memory array 1101 can include a plurality of memory blocks on an integrated circuit or multi-chip module. A controller is coupled to the memory array to execute commands with addresses to access addressed memory blocks in the plurality of memory blocks. A memory device includes a refresh mapping table 1128 accessible by the controller 1125. The refresh mapping table has one or more entries, an entry in the refresh mapping table mapping of an address identifying an addressed memory block set for refresh to a backup block address. An addressed memory block can be a risky memory block, as described in reference to FIG. 1B.

In this example, the memory device 1100 includes a flash memory that comprises a first portion characterized as a normal array 1101 and a second portion characterized as an ECC array 1102. The normal array 1101 stores blocks of data while the ECC array 1102 stores ECC's for corresponding blocks of data in the normal array 1101. The ECCs are computed and stored with the blocks of data during programming so that they accurately reflect the contents of the corresponding blocks of data.

A set of sense amplifiers 1103 is operatively coupled via lines 1122 with the normal array 1101, and a set of sense amplifiers 1104 is operatively coupled via lines 1122 with the ECC array 1102. In this example, a page buffer 1120 is operatively coupled to the memory array in the sense that data is moved thought the page buffer and utilized during sensing and programming of data into the normal array 1101 and ECC array 1102. Likewise, the sense amplifiers 1104 are operatively coupled to the arrays 1101 and 1102, in the sense that they are used in the sensing of data stored in the array. Also, word line drivers 1121 are associated with the normal array 1101 and ECC array 1102. The arrangement of sense amplifier and page buffers illustrated is like that in some NAND architecture devices. The arrangement varies in different embodiments, including embodiments configured for NOR architecture devices and for other memory technologies.

The integrated circuit 1100 includes an address counter 1112 or other address logic, that is used to provide addresses on line 1110 to word line drivers 1121, to the page buffer 1120, or other type of column decoder, and to the output data multiplexer 1107. The address counter 1112 can be controlled by an on-chip controller 1125. Also, the address counter 1112 can be utilized by the output data multiplexer 1107 to control the outputting of a block of data to the external host (210, FIG. 2).

The memory device also includes circuitry for providing bias voltages necessary for programming, erasing and reading in the case of flash memory, or for setting, resetting and reading in the case of other types of nonvolatile memory. The circuitry for providing bias voltages can include charge pumps, voltage dividers, current sources, voltage regulators and other circuit elements suitable for implementation on integrated circuits.

The sense amplifiers 1103 and 1104 are arranged to provide the blocks of data (which can be for example 128 bits) and the corresponding ECCs (which can be for example 11 bits) to ECC logic 1105. Also, the set of sense amplifiers 1103 coupled with the normal array is arranged to provide its output data to a correction multiplexer 1106, which can be in the form of a cache memory, for example. The ECC logic 1105 generates an output that identifies the locations of error bits in the corresponding block and provides the locations to the correction multiplexer 1106, where the erroneous bits are corrected. The output of the correction multiplexer 1106 is a corrected block of data applied to an output data multiplexer 1107, where the block can be provided to an input/output interface 1130 as a sequence of 11-bit bytes for example. The input/output interface 1130 can provide data to an external host, using a bus protocol specified for the particular embodiment.

The input/output interface 1130 can also receive data from an external host for writing into the memory array. Thus, in the block diagram, a data path 1109 from the data multiplexer 1107 to the sense amplifiers 1103, 1104 and page buffer 1120 is illustrated. During a write operation, the page buffer 1120 can be loaded with a data pattern including a data block and a corresponding ECC, which can be programmed and verified according to the procedures appropriate for the type of memory technology. The page buffer can store one block and one corresponding ECC, in some embodiments. In other embodiments, the page buffer may store more than one block and more than one corresponding ECC. The size of the page buffer 1120 can be designed as suits a particular implementation of the technology, with consideration of the type of ECC logic utilized along with other characteristics of the memory device.

The input/output interface 1130 is coupled in this example also to command logic 1126, in which commands from an external host can be decoded and applied to a controller 1125 on the integrated circuit. Here commands from an external host can include a refresh command sequence as described herein. The command logic 1126 may generate internal control signals that are applied to controller 1125.

According to embodiments of the technology described herein, the controller 1125 can be responsive to a refresh command sequence with a refresh block address to execute a refresh operation. The refresh operation can include storing a backup copy of data from the addressed memory block having the refresh block address to a backup block, setting an entry in the refresh mapping table to map the refresh block address to the backup block, refreshing the addressed memory block having the refresh block address using data from the backup block, and resetting the entry upon completion of the refresh operation for the addressed memory block.

The controller 1125 can be configured to execute a procedure to recover from an interrupt to scan the refresh mapping table for a set entry, to complete the refresh operation for the addressed memory block identified in the set entry, and to reset the set entry upon completion of the refresh operation.

The controller 1125 can comprise one or more state machines or other logic constructs by which control signals are generated and applied to components of the memory for the purposes of executing embedded operating procedures, including write procedures and read procedures. For flash memory, the write procedures can include programming procedures and erasing procedures.

The controller 1125 can be implemented using special-purpose logic circuitry, programmable logic circuitry, a general purpose processor with control code stored on the integrated circuit executed to implement the controller 1125, and by a combination of such elements. A state machine or state machines in the controller 1125 can be configured to execute embedded operating procedures by applying appropriate timing and control signals to the various circuitry components of the device.

In one example, the memory comprises a flash memory such as a high-density NAND flash memory. Other types of memory technologies can be utilized as well, including phase change memory PCM, programmable resistance memory known as ReRAM or RRAM, NOR flash memory, magnetoresistive memory, and so on. Also, other types of memory technologies can be utilized, including volatile memory such as DRAM or SRAM.

A number of flowcharts illustrating logic executed by a memory controller or by memory device are described herein. The logic can be implemented using processors programmed using computer programs stored in memory accessible to the computer systems and executable by the processors, by dedicated logic hardware, including field programmable integrated circuits, and by combinations of dedicated logic hardware and computer programs. With all flowcharts herein, it will be appreciated that many of the steps can be combined, performed in parallel or performed in a different sequence without affecting the functions achieved. In some cases, as the reader will appreciate, a re-arrangement of steps will achieve the same results only if certain other changes are made as well. In other cases, as the reader will appreciate, a re-arrangement of steps will achieve the same results only if certain conditions are satisfied. Furthermore, it will be appreciated that the flow charts herein show only steps that are pertinent to an understanding of the invention, and it will be understood that numerous additional steps for accomplishing other functions can be performed before, after and between those shown.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
   a memory including a plurality of memory blocks on an integrated circuit or multi-chip module;
   a controller on the integrated circuit or multi-chip module coupled to the memory to execute commands with addresses to access addressed memory blocks in the plurality of memory blocks;
   a refresh mapping table in non-volatile memory on the integrated circuit or multi-chip module accessible by the controller, the refresh mapping table having one or more entries, an entry in the refresh mapping table mapping of an address identifying an addressed memory block set for refresh to a backup block address;
   the controller responsive to a refresh command sequence with a refresh block address to execute a refresh operation, the refresh operation including storing a backup copy of data from the addressed memory block having the refresh block address to a backup block, setting an entry in the refresh mapping table to map the refresh block address to the backup block, refreshing the addressed memory block having the refresh block address using data from the backup block, and resetting the entry upon completion of the refresh operation for the addressed memory block;
   the controller configured to execute a procedure to restore mapping of the refresh block address to the backup block address upon power-on of the memory device, to scan the refresh mapping table for a set entry mapping the refresh block address to the backup block address, and to register the set entry in the refresh mapping table.

2. The memory device of claim 1, wherein the refresh mapping table includes a refresh mapping memory area storing the one or more entries, and a refresh mapping circuit registering the set entry mapping the refresh block address to the backup block.

3. The memory device of claim 1, wherein in the refresh operation, refreshing the addressed memory block includes erasing the addressed memory block, and then copying the backup copy from the backup block to the addressed memory block.

4. The memory device of claim 1, including in the refresh operation prior to storing the backup copy in the backup block, erasing the backup block.

5. The memory device of claim 1, wherein the refresh mapping table comprises a journal format table, wherein setting the entry includes writing a valid entry in the journal format table, and resetting the entry includes marking the entry invalid.

6. The memory device of claim 1, wherein the refresh mapping table comprises a backup block list registering a set of backup blocks, with the entries stored inside corresponding backup blocks in the set of backup blocks, wherein setting the entry includes writing an active flag in an available block in the set of backup blocks, and resetting the entry includes erasing at least the active flag in the block or writing an inactive flag.

7. A method for operating a memory device, wherein the memory device comprises a memory including a plurality of memory blocks on an integrated circuit, a refresh mapping table in non-volatile memory on the integrated circuit having one or more entries, an entry in the refresh mapping table mapping a refresh block address to a backup block address, and a controller on the integrated circuit coupled to the memory to execute commands with addresses to access addressed memory blocks in the plurality of memory blocks, the method comprising, by the controller of the memory device:

executing a procedure to restore mapping of the refresh block address to the backup block address upon power-on of the memory device by scanning the refresh mapping table for a set entry mapping the refresh block address to the backup block address; and registering the set entry in the refresh mapping table.

8. The method of claim 7, wherein the refresh mapping table includes a refresh mapping memory area storing the one or more entries, and a refresh mapping circuit, the method comprising:

scanning the refresh mapping memory area in the refresh mapping table for the set entry; and registering the set entry mapping the refresh block address to the backup block in the refresh mapping circuit in the refresh mapping table.

9. A method for operating a memory device, by an external host coupled to the memory device, wherein the memory device comprises a memory including a plurality of memory blocks on an integrated circuit, and a refresh mapping table in non-volatile memory on the integrated circuit having one or more entries, an entry in the refresh mapping table mapping of an address identifying an addressed memory block set for refresh to a backup block address, the method comprising:

executing a refresh operation by issuing a refresh command sequence with a refresh block address to the memory device, the refresh operation including:

storing a backup copy of data from the addressed memory block at the refresh block address in a backup block;

setting a mapping entry in the refresh mapping table to map the refresh block address to an address of the backup block;

refreshing the addressed memory block at the refresh block address using data from the backup block; and resetting the mapping entry upon completion of the refresh operation for the addressed memory block.

10. The method of claim 9, wherein in the refresh operation, said refreshing the addressed memory block includes:

erasing the addressed memory block at the refresh block address; and then copying the backup copy from the backup block to the addressed memory block.

11. The method of claim 9, the refresh operation including prior to said storing the backup copy in the backup block, erasing the backup block.

12. The method of claim 9, wherein the refresh mapping table comprises a journal format table, wherein setting the mapping entry includes:

writing a valid entry in the journal format table; and resetting the entry includes marking the entry invalid.

13. The method of claim 9, wherein the refresh mapping table comprises a backup block list registering a set of backup blocks, with the entries stored inside corresponding backup blocks in the set of backup blocks, wherein said setting the mapping entry includes writing an active flag in an available block in the set of backup blocks; and said resetting the mapping entry includes erasing at least the active flag in the block or writing an inactive flag.

14. The method of claim 10, the refresh operation comprising:

determining status of a copying operation started before an interrupt;

if the status indicates the copying operation is not recoverable, erasing the addressed memory block and copying the backup copy from the backup block to the addressed memory block; and if the status indicates the copying operation is recoverable, resetting the mapping entry upon completion of the refresh operation for the addressed memory block.

15. The method of claim 10, including prior to said executing the refresh operation, issuing a command sequence for:

fetching data from the memory device at the input block address;

checking ECC status for the fetched data on the input block address; and if the ECC status indicates a block at the input block address needs refresh, registering the refresh command sequence with the input block address in the host including registering the input block address as the refresh block address in the host.

\* \* \* \* \*